(12) United States Patent
Lee et al.

(10) Patent No.: US 11,508,778 B2
(45) Date of Patent: Nov. 22, 2022

(54) LIGHT EMITTING DEVICE FOR DISPLAY AND DISPLAY APPARATUS HAVING THE SAME

(71) Applicant: SEOUL VIOSYS CO., LTD., Ansan-si (KR)

(72) Inventors: Seom Geun Lee, Ansan-si (KR); Seong Kyu Jang, Ansan-si (KR); Chan Seob Shin, Ansan-si (KR); Ho Joon Lee, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 63 days.

(21) Appl. No.: 15/930,979

(22) Filed: May 13, 2020

(65) Prior Publication Data

US 2020/0373348 A1 Nov. 26, 2020

Related U.S. Application Data

(60) Provisional application No. 62/850,674, filed on May 21, 2019.

(51) Int. Cl.
*H01L 27/15* (2006.01)
*H01L 33/30* (2010.01)
(Continued)

(52) U.S. Cl.
CPC .......... *H01L 27/15* (2013.01); *H01L 25/0655* (2013.01); *H01L 33/30* (2013.01);
(Continued)

(58) Field of Classification Search
CPC ....... H01L 27/15; H01L 33/30; H01L 33/382; H01L 33/42; H01L 33/62; H01L 25/0655;
(Continued)

(56) References Cited

U.S. PATENT DOCUMENTS 8,035,115 B2 10/2011 Ogihara et al.
2006/0255343 A1 11/2006 Ogihara et al.
(Continued)

FOREIGN PATENT DOCUMENTS

JP 2006-319099 11/2006
KR 10-2017-0115142 10/2017
KR 10-2019-0001050 1/2019

OTHER PUBLICATIONS

International Search Report dated Sep. 3, 2020, issued in International Application No. PCT/KR2020/006348 (with English Translation).

*Primary Examiner* — Su C Kim
(74) *Attorney, Agent, or Firm* — H.C. Park & Associates, PLC

(57) ABSTRACT

A light emitting device for a display including a first LED stack, a second LED stack disposed thereunder, a third LED stack disposed thereunder and including first and second conductivity type semiconductor layers, a first bonding layer between the second and third LED stacks, a second bonding layer between the first and second LED stacks, an insulation layer between the second bonding layer and the second LED stack, lower buried layers passing through the second LED stack and the insulation layer and electrically connected to the first and second conductivity type semiconductor layers of the third LED stack, respectively, upper buried layers passing through the first LED stack and the second bonding layer and electrically connected to the lower buried layers, and upper connectors disposed on the first LED stack and including upper connectors covering and electrically connected to the upper buried layers, respectively.

21 Claims, 16 Drawing Sheets

(51) Int. Cl.
    *H01L 33/38*          (2010.01)
    *H01L 33/42*          (2010.01)
    *H01L 33/62*          (2010.01)
    *H01L 25/065*        (2006.01)
    *H01L 33/44*          (2010.01)

(52) U.S. Cl.
    CPC ............ *H01L 33/382* (2013.01); *H01L 33/42* (2013.01); *H01L 33/44* (2013.01); *H01L 33/62* (2013.01); *H01L 2933/0016* (2013.01); *H01L 2933/0025* (2013.01); *H01L 2933/0066* (2013.01)

(58) Field of Classification Search
    CPC ............ H01L 33/44; H01L 2933/0066; H01L 2933/0016; H01L 2933/0025; H01L 25/0753; H01L 25/0756; H01L 27/153
    See application file for complete search history.

(56) References Cited

U.S. PATENT DOCUMENTS

| | | | | |
|---|---|---|---|---|
| 2015/0325555 | A1* | 11/2015 | Hashimoto | ............ H01L 33/42 257/89 |
| 2017/0288093 | A1* | 10/2017 | Cha | ........................ H01L 33/08 |
| 2019/0006413 | A1 | 1/2019 | Jacob et al. | |
| 2019/0097088 | A1* | 3/2019 | Huppmann | ............ H01L 33/62 |
| 2019/0103510 | A1 | 4/2019 | Cha et al. | |
| 2020/0212017 | A1 | 7/2020 | Oh et al. | |

* cited by examiner

LIGHT EMITTING DEVICE FOR DISPLAY AND DISPLAY APPARATUS HAVING THE SAME

CROSS-REFERENCE TO RELATED APPLICATION

This application claims priority from and the benefit of U.S. Provisional Application No. 62/850,674, filed on May 21, 2019, which is hereby incorporated by reference for all purposes as if fully set forth herein.

BACKGROUND

Field

Exemplary embodiments of the invention relate generally to a light emitting device for a display and a display apparatus, and, more particularly, to a light emitting device having a stack structure of a plurality of LEDs for a display, and a display apparatus including the same.

Discussion of the Background

As an inorganic light source, light emitting diodes have been used in various technical fields including displays, vehicular lamps, general lighting, and the like. With various advantages of the light emitting diodes, such as longer lifespan, lower power consumption, and rapid response, than conventional light sources, light emitting diodes have been replacing conventional existing light sources.

Light emitting diodes have been used as backlight light sources in display apparatuses. However, LED displays that directly display images using the light emitting diodes have been recently developed.

In general, a display apparatus realizes various colors through mixture of blue, green, and red light. In order to realize various images, the display apparatus includes a plurality of pixels, each including sub-pixels corresponding to blue, green, and red light, respectively. In this manner, a color of a certain pixel is determined based on the colors of the sub-pixels so that images can be displayed through combination of such pixels.

Since LEDs can emit various colors depending upon materials thereof, a display apparatus may be configured by arranging individual LED chips emitting blue, green, and red light on a two-dimensional plane. However, when one LED chip is provided to each sub-pixel, the number of LED chips may be significantly increased, which may require excessive time for a mounting process, for example, during manufacture.

Moreover, when the sub-pixels are arranged on the two-dimensional plane in the display apparatus, a relatively large area is occupied by one pixel that includes the sub-pixels for blue, green, and red light. In this case, when an area of each sub-pixel is reduced to arrange the sub-pixels in a restricted area, luminous area of the sub-pixels may be reduced, thereby deteriorating the brightness of the pixels.

The above information disclosed in this Background section is only for understanding of the background of the inventive concepts, and, therefore, it may contain information that does not constitute prior art.

SUMMARY

Light emitting devices for displays constructed according to exemplary embodiments of the invention are capable of increasing an area of each sub-pixel in a restricted pixel area and a display apparatus including the same.

Exemplary embodiments also provide a light emitting device for a display that is capable of reducing a time associated with a mounting process and a display apparatus including the same.

Exemplary embodiments further provide a light emitting device for a display that is capable of increasing the production yield and a display apparatus including the same.

Additional features of the inventive concepts will be set forth in the description which follows, and in part will be apparent from the description, or may be learned by practice of the inventive concepts.

A light emitting device for a display according to an exemplary embodiment includes: a first LED stack; a second LED stack disposed under the first LED stack; a third LED stack disposed under the second LED stack, and including a first conductivity type semiconductor layer and a second conductivity type semiconductor layer; a first bonding layer interposed between the second LED stack and the third LED stack; a second bonding layer interposed between the first LED stack and the second LED stack; a lower insulation layer interposed between the second bonding layer and the second LED stack; lower buried layers passing through the second LED stack and the lower insulation layer to be electrically connected to the first conductivity type semiconductor layer and the second conductivity type semiconductor layer of the third LED stack, respectively; upper buried layers passing through the first LED stack and the second bonding layer to be electrically connected to the lower buried layers; and a plurality of upper connectors disposed on the first LED stack, in which the upper connectors include upper connectors covering the upper buried layers and electrically connected to the upper buried layers, respectively.

A display apparatus according to another exemplary embodiment includes: a circuit board; and a plurality of light emitting devices arranged on the circuit board, in which each of the light emitting devices is the light emitting device set forth above, and the electrode pads are electrically connected to the circuit board.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION

Figure 1:
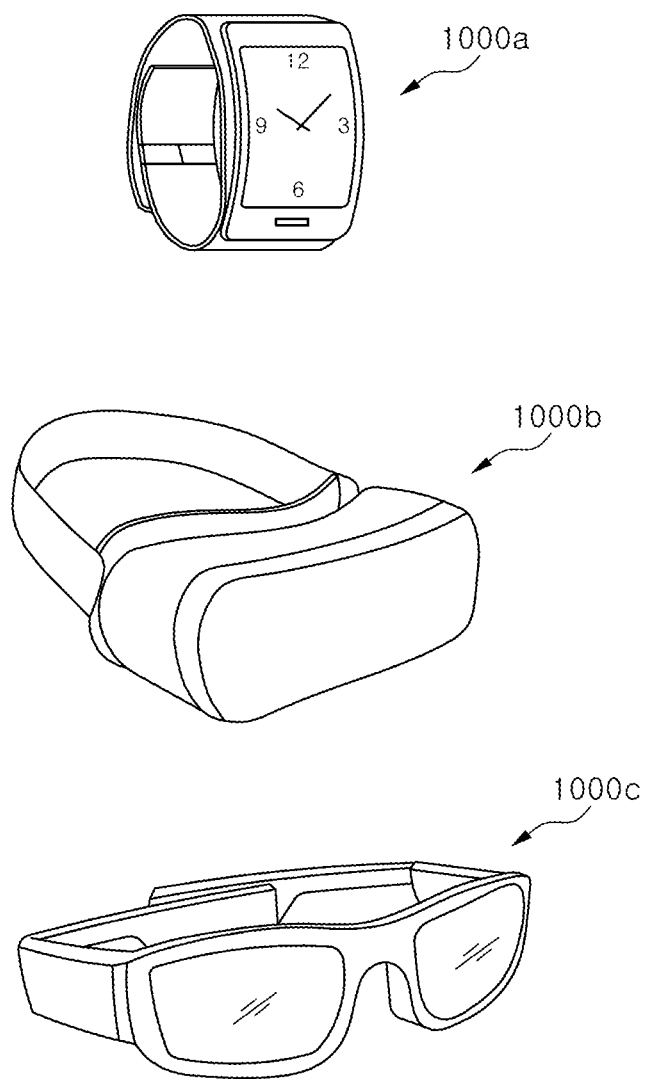
FIG. 1 shows schematic perspective views illustrating display apparatuses according to exemplary embodiments.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A light emitting device for a display according to an exemplary embodiment includes: a first LED stack; a second LED stack disposed under the first LED stack; a third LED stack disposed under the second LED stack; a first bonding layer interposed between the second LED stack and the third LED stack; a second bonding layer interposed between the first LED stack and the second LED stack; a lower insulation layer interposed between the second bonding layer and the second LED stack; lower buried layers passing through the lower insulation layer and the second LED stack to be electrically connected to a first conductivity type semiconductor layer and a second conductivity type semiconductor layer of the third LED stack, respectively; upper buried layers passing through the first LED stack and the second bonding layer to be electrically connected to the lower buried layers; and a plurality of upper connectors disposed on the first LED stack, in which the upper connectors include upper connectors covering the upper buried layers and electrically connected to the upper buried layers, respectively.

Hereinafter, the second LED stack is described as being disposed under the first LED stack, and the third LED stack is described as being disposed under the second LED stack, however, in some exemplary embodiments, the light emitting device may be flip-bonded. In this case, upper and lower positions of these first, second, and third LED stacks may be reversed.

When the first, second, and third LED stacks are stacked one above another, the light emitting device may have an increased luminous area of each sub-pixel without increasing a pixel area.

In an exemplary embodiment, the first LED stack may emit light having a longer wavelength than that emitted from the second LED stack, and the second LED stack may emit light having a longer wavelength than that emitted from the third LED stack. For example, the first, second, and third LED stacks may emit red light, green light, and blue light, respectively. In another exemplary embodiment, the first LED stack may emit light having a longer wavelength than that emitted from the second LED stack, and the second LED stack may emit light having a shorter wavelength than that emitted from the third LED stack. For example, the first, second, and third LED stacks may emit red light, blue light, and green light, respectively.

The first, second, and third LED stacks may be independently driven, light generated from the first LED stack may be emitted to the outside through the second LED stack and the third LED stack, and light generated from the second LED stack may be emitted to the outside through the third LED stack.

In an exemplary embodiment, the upper buried layers may have narrower widths than those of the lower buried layers. Further, the upper buried layers may be disposed on upper surfaces of the lower buried layers, respectively. However, the inventive concepts are not limited thereto.

The light emitting device for a display may further include: an n-electrode pad electrically connected to the first conductivity type semiconductor layer of the third LED stack; and a lower p-electrode pad disposed on the second conductivity type semiconductor layer of the third LED stack, in which the lower buried layers may be electrically connected to the n-electrode pad and the lower p-electrode pad, respectively.

The light emitting device for a display may further include: a lower buried layer passing through the lower insulation layer to be electrically connected to a first conductivity type semiconductor layer of the second LED stack; and an upper buried layer passing through the first LED stack and the second bonding layer to be electrically connected to the lower buried layer, in which one of the upper connectors may be electrically connected to the first conductivity type semiconductor layer of the second LED stack through the upper buried layer and the lower buried layer.

The one of the upper connectors may be an upper common connector electrically connected to first conductivity type semiconductor layers of the first, second, and third LED stacks.

The light emitting device for a display may further include: an upper buried layer passing through the first LED stack, the first bonding layer, and the lower insulation layer to be electrically connected to a second conductivity type semiconductor layer of the second LED stack, in which one of the upper connectors may be connected to the upper buried layer to be electrically connected to the second conductivity type semiconductor layer of the second LED stack.

The one of the upper connectors may be electrically connected to a second conductivity type semiconductor layer of the first LED stack.

The light emitting device for a display may further include: an intermediate insulation layer disposed between the first LED stack and the upper connectors; and an upper buried layer passing through the intermediate insulation layer to be electrically connected to the second conductivity type semiconductor layer of the first LED stack, in which the one of the upper connectors may be electrically connected to the second conductivity type semiconductor layer of the first LED stack through the upper buried layer.

The light emitting device for a display may further include: bump pads disposed on the upper connectors, in which the bump pads may include first, second, and third bump pads and common bump pads, the common bump pad may be commonly electrically connected to the first, second, and third LED stacks, and the first, second, and third bump pads may be electrically connected to the first, second, and third LED stacks, respectively.

The light emitting device for a display may further include: a first transparent electrode interposed between the first LED stack and the second LED stack, and in ohmic contact with a lower surface of the first LED stack; a second transparent electrode interposed between the first LED stack and the second LED stack, and in ohmic contact with an upper surface of the second LED stack; and a third transparent electrode interposed between the second LED stack and the third LED stack, and in ohmic contact with an upper surface of the third LED stack, in which any one of the first, second, and third transparent electrodes may be formed of a material different from the remaining transparent electrodes.

For example, the first transparent electrode may be formed of indium-tin-oxide (ITO), and the second and third transparent electrodes may be formed of ZnO.

In an exemplary embodiment, each of the first, second, and third transparent electrodes may contact the second conductivity type semiconductor layer, and the second and third transparent electrodes may be recessed to have a smaller area than that of the second conductivity type semiconductor layer of the second LED stack and that of the second conductivity type semiconductor layer of the third LED stack, respectively.

The light emitting device for a display may further include: an upper p-electrode pad disposed on the second transparent electrode to be electrically connected to the second conductivity type semiconductor layer of the second LED stack; and an upper buried layer passing through the first LED stack to be electrically connected to the upper p-electrode pad, in which the one of the upper connectors may be connected to the upper buried layer to be electrically connected to the upper p-electrode pad.

The light emitting device for a display may further include: a first sidewall insulation layer covering sidewalls of the lower buried layer; and a second sidewall insulation layer covering sidewalls of the upper buried layer. The first and second sidewall insulation layers may be formed of $Al_2O_3$.

The first, second, and third LED stacks may be stacks separated from a growth substrate. As such, the light emitting device does not have the growth substrate.

The light emitting device for a display may further include: an intermediate insulation layer covering the first LED stack, in which upper surfaces of the lower buried layers may be in flush with an upper surface of the lower insulation layer, and upper surfaces of the upper buried layers may be in flush with an upper surface of the intermediate insulation layer.

A display apparatus according to an exemplary embodiment includes: a circuit board; and a plurality of light emitting devices arranged on the circuit board, in which each of the light emitting devices may be any one of the light emitting device set forth above, and the bump pads are electrically connected to the circuit board.

Hereinafter, exemplary embodiments of the inventive concepts will be described in detail with reference to the accompanying drawings.

FIG. 1 shows schematic perspective views illustrating display apparatuses according to exemplary embodiments.

The display apparatus according to exemplary embodiments may be used in a virtual reality (VR) display apparatus, such as a smart watch 1000a, a VR headset 1000b, and an augmented reality (AR) display apparatus, such as augmented reality glasses 1000c. However, the inventive concepts are not limited thereto.

Figure 2:
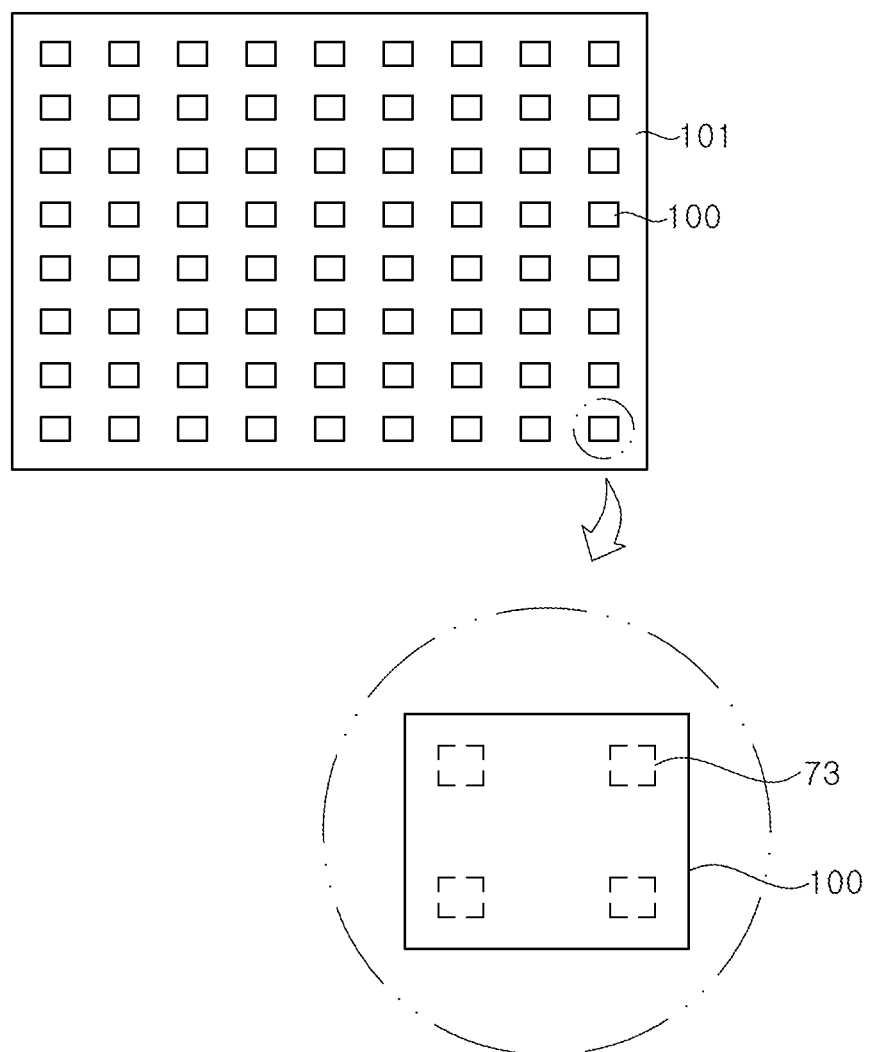
FIG. 2 is a schematic plan view illustrating a display panel according to an exemplary embodiment.

The display apparatus may include a display panel for displaying an image. FIG. 2 is a schematic plan view illustrating the display panel according to an exemplary embodiment.

Referring to FIG. 2, the display panel includes a circuit board 101 and light emitting devices 100.

The circuit board 101 may include a circuit for passive matrix driving or active matrix driving. In an exemplary embodiment, the circuit board 101 may include interconnection lines and resistors. In another exemplary embodiment, the circuit board 101 may include interconnection lines, transistors, and capacitors. The circuit board 101 may also have pads disposed on an upper surface thereof to allow electrical connection to the circuit therein.

A plurality of light emitting devices 100 are arranged on the circuit board 101. Each of the light emitting devices 100 may form one pixel. The light emitting device 100 includes bump pads 73, and the bump pads 73 are electrically connected to the circuit board 101. For example, the bump pads 73 may be bonded to pads exposed on the circuit board 101.

An interval between the light emitting devices 100 may be greater than a width of the light emitting device 100.

Figure 3:
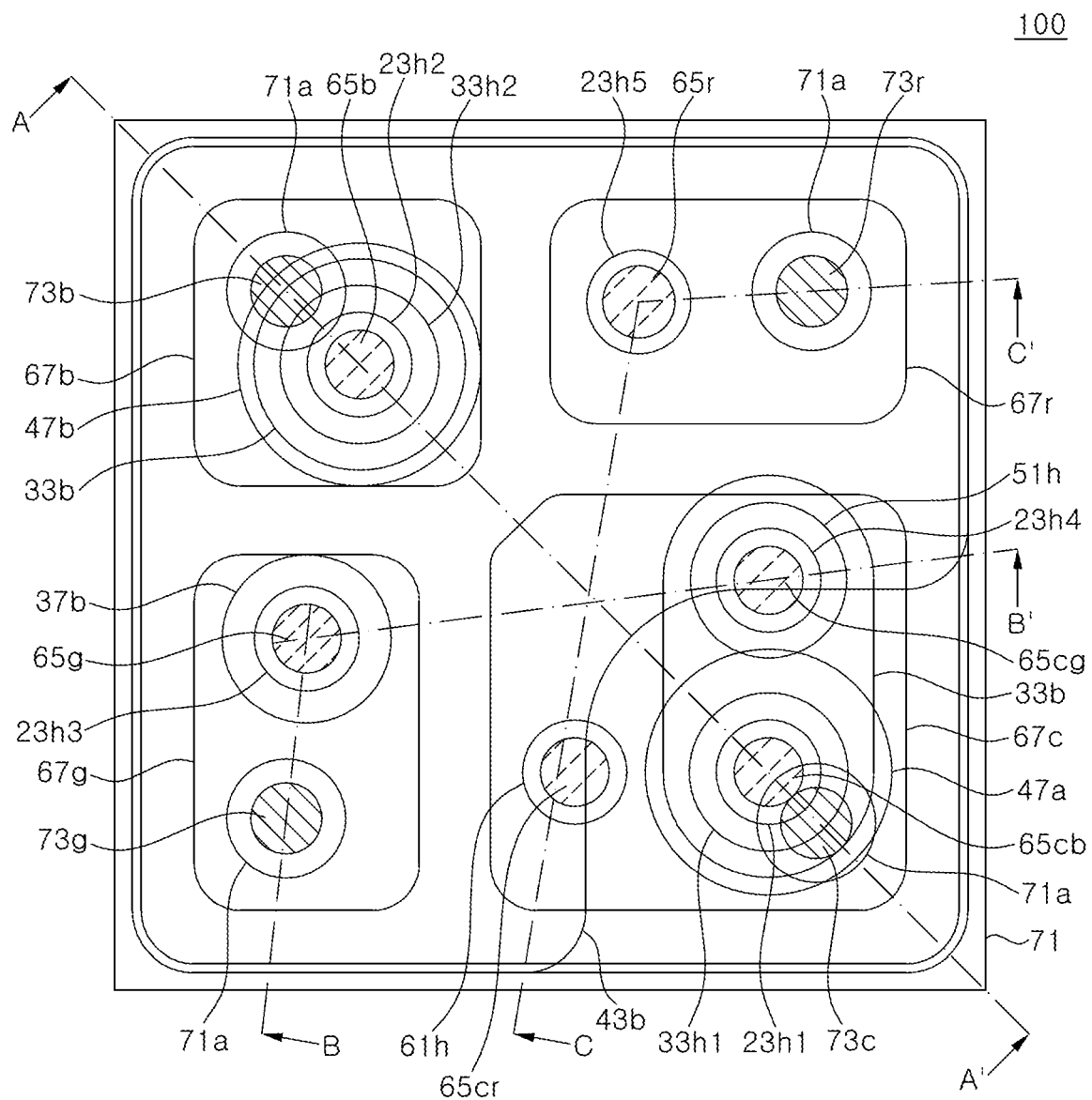
FIG. 3 is a schematic plan view illustrating a light emitting device according to an exemplary embodiment.

A configuration of the light emitting device 100 according to an exemplary embodiment will be described with reference to FIG. 3, FIG. 4A, FIG. 4B, and FIG. 4C. FIG. 3 is a schematic plan view illustrating a light emitting device 100 according to an exemplary embodiment, FIG. 4A, FIG. 4B, and FIG. 4C are schematic cross-sectional views taken along lines A-A', B-B', and C-C' of FIG. 3, respectively.

Hereinafter, bump pads 73r, 73b, 73g, and 73c will exemplarily illustrated and described as being disposed at an upper side of the light emitting device 100, however, the inventive concepts are not limited thereto. For example, in some exemplary embodiments, the light emitting device 100 may be flip-bonded on the circuit board 101 shown in FIG. 2, and in this case, the bump pads 73r, 73b, 73g, and 73c may be disposed at a lower side of the light emitting device 100. Furthermore, in some exemplary embodiments, the bump pads 73r, 73b, 73g, and 73c may be omitted.

Referring to FIG. 3, FIG. 4A, FIG. 4B, and FIG. 4C, the light emitting device 100 may include a first LED stack 23, a second LED stack 33, a third LED stack 43, a first transparent electrode 25, a second transparent electrode 35, a third transparent electrode 45, an n-electrode pad 47a, a lower p-electrode pad 47b, an upper p-electrode pad 37b, lower buried layers 55b, 55cb, and 55cg, upper buried layers 65r, 65b, 65g, and 65cr, a first sidewall insulation layer 53, an upper common connector 67c, a first upper connector 67r, a second upper connector 67g, a third upper connector 67b, a first bonding layer 49, a second bonding layer 59, a lower insulation layer 51, an intermediate insulation layer 61, an upper insulation layer 71, and the bump pads 73r, 73b, 73g, and 73c. The light emitting device 100 may further include through holes 23h1, 23h2, 23h3, 23h4, and 23h5 passing through the first LED stack 23, and through holes 33h1 and 33h2 passing through the second LED stack 33.

Figure 4A:
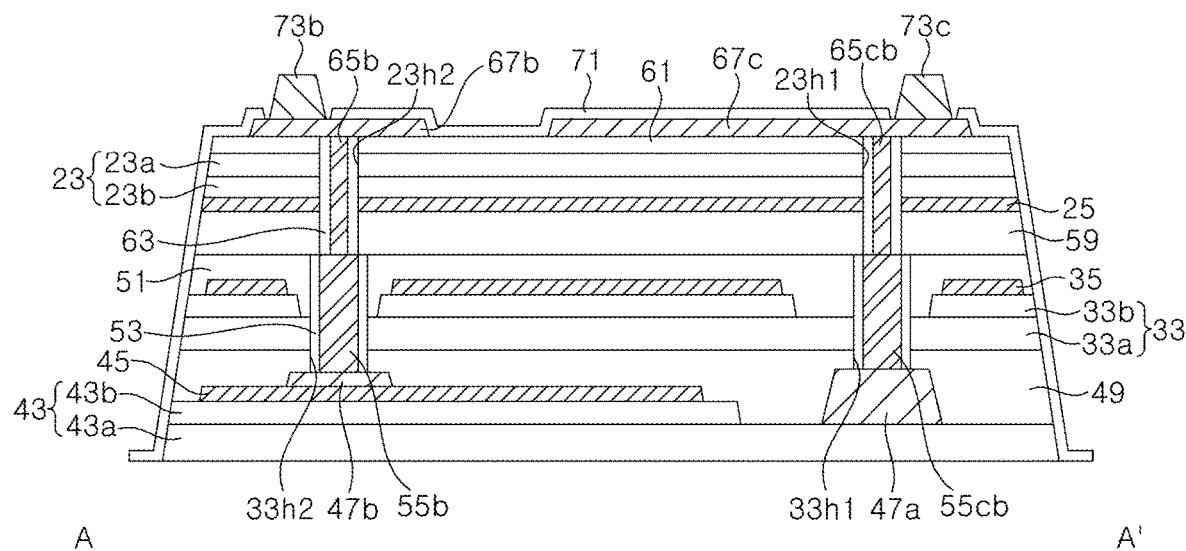
FIGS. 4A, 4B, and 4C are schematic cross-sectional views taken along lines A-A', B-B', and C-C' of FIG. 3, respectively.
Figure 4B:
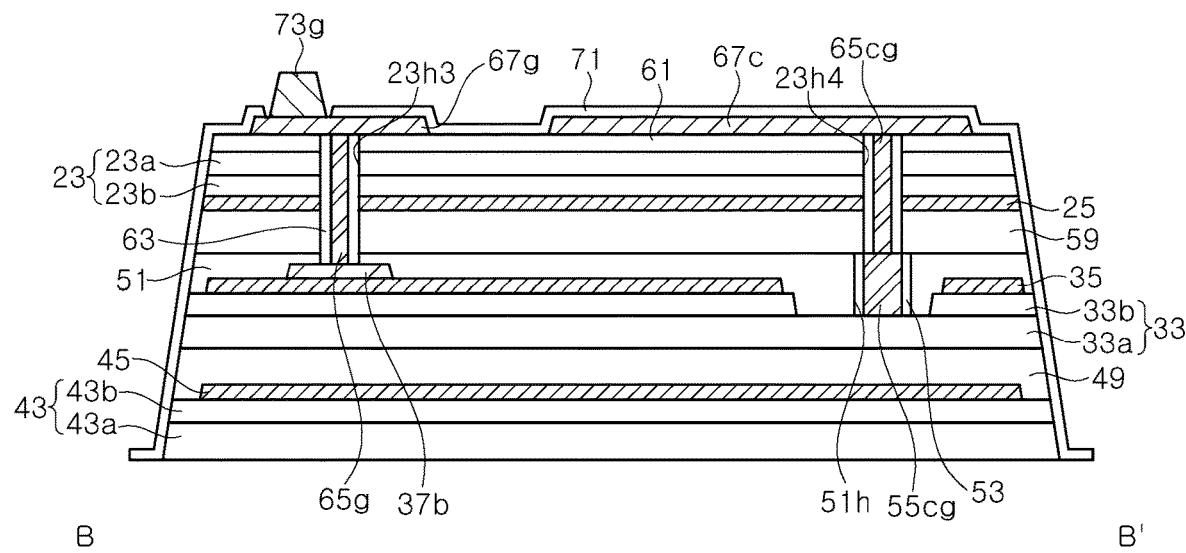
Figure 4C:
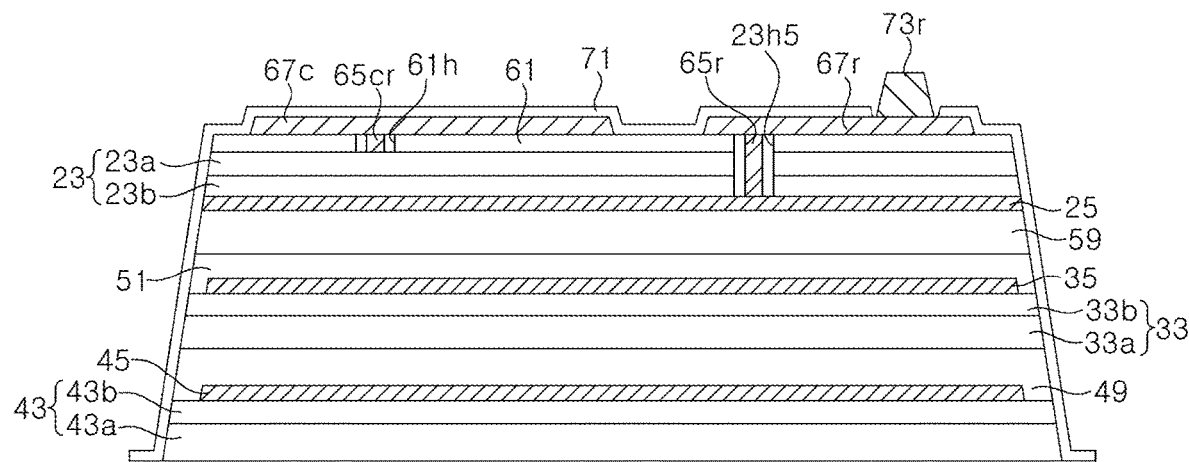

As shown in FIG. 4A, FIG. 4B, and FIG. 4C, the first, second, and third LED stacks 23, 33, and 43 according to an exemplary embodiment are stacked in the vertical direction. The first, second, and third LED stacks 23, 33, and 43 may be grown on different growth substrates from one another. According to the illustrated exemplary embodiment, each of the growth substrates may be removed from the final light emitting device 100. As such, the light emitting device 100 does not include the growth substrates of the first, second, and third LED stacks 23, 33, and 43. However, the inventive concepts are not limited thereto, and in some exemplary embodiments, at least one of the growth substrates may be included in the light emitting device 100.

Each of the first LED stack 23, the second LED stack 33, and the third LED stack 43 includes a first conductivity type semiconductor layer 23a, 33a, or 43a, a second conductivity type semiconductor layer 23b, 33b, or 43b, and an active layer interposed therebetween. The active layer may have a multiple quantum well structure, for example.

The second LED stack 33 is disposed under the first LED stack 23, and the third LED stack 43 is disposed under the second LED stack 33. Light generated in the first, second, and third LED stacks 23, 33, and 43 may be emitted to the outside through the third LED stack 43. Accordingly, according to an exemplary embodiment, the first LED stack 23 emits light having a longer wavelength than those emitted from the second and third LED stacks 33 and 43, and the second LED stack 33 emits light having a longer wavelength than that emitted from the third LED stack 43. For example, the first LED stack 23 may be an inorganic light emitting diode emitting red light, the second LED stack 33 may be an inorganic light emitting diode emitting green light, and the third LED stack 43 may be an inorganic light emitting diode to emitting blue light. For example, the first LED stack 23 may include an AlGaInP-based well layer, the second LED stack 33 may include an AlGaInP or AlGaInN-based well layer, and the third LED stack 43 may include an AlGaInN-based well layer.

In some exemplary embodiments, while light generated in the first, second, and third LED stacks 23, 33, and 43 may be emitted to the outside through the third LED stack 43, at least one of the first, second, and third LED stacks 23, 33, and 43 may emit light having a shorter wavelength than that emitted from the LED stack disposed thereunder along the path of light. For example, the first LED stack 23 may be an inorganic light emitting diode emitting red light, the second LED stack 33 may be an inorganic light emitting diode emitting blue light, and the third LED stack 43 may be an inorganic light emitting diode to emitting blue light. In still another exemplary embodiment, the light emitting device 100 may include two, or four or more LED stacks. In this case, each of the LED stacks may emit light having a wavelength different from each other, or at least two of the LED stacks may emit light having substantially the wavelength. Hereinafter, the light emitting device 100 will exemplarily be described as including the first, second, and third LED stacks 23, 33, and 43 emitting red light, green light, and blue light, respectively.

Since the first LED stack 23 emits light having the longer wavelength than those emitted from the second and third LED stacks 33 and 43, light generated from the first LED stack 23 may be emitted to the outside after passing through the second and third LED stacks 33 and 43. In addition, since the second LED stack 33 emits light having a longer wavelength than that emitted from the third LED stack 43, light generated from the second LED stack 33 may be emitted to the outside after passing through the third LED stack 43.

The first conductivity type semiconductor layer 23a, 33a, or 43a of each of the LED stacks 23, 33, and 43 may be an n-type semiconductor layer, and the second conductivity type semiconductor layer 23b, 33b, or 43b thereof may be a p-type semiconductor layer. In addition, according to the illustrated exemplary embodiment, the n-type semiconductor layer 23a may be disposed on the upper surface of the first LED stack 23, the p-type semiconductor layer 33b may be disposed on the upper surface of the second LED stack 33, and the p-type semiconductor layer 43b may be disposed on the upper surface of the third LED stack 43. More particularly, the first LED stack 23 has a stacked sequence of semiconductor layers different from those in the second and third LED stacks 33 and 43. The semiconductor layers of the second LED stack 33 are stacked in the same order as the semiconductor layers of the third LED stack 43, and thus, process stability may be enhanced, which will be described in more detail later with reference to a manufacturing method. However, the inventive concepts are not limited thereto. In some exemplary embodiments, the first conductivity type semiconductor layer 23a, 33a, or 43a of each of the LED stacks 23, 33, and 43 may be a p-type semiconductor layer, and the second conductivity type semiconductor layer 23b, 33b, and 43b thereof may be an n-type semiconductor layer.

The second LED stack 33 includes a mesa etching region, in which a portion of the second conductivity type semiconductor layer 33b is removed to expose an upper surface of the first conductivity type semiconductor layer 33a. As shown in FIG. 3 and FIG. 4A, lower buried layers 55b and 55cb are formed through the mesa etching region of the second LED stack 33, and a lower buried layer 55cg is also formed on the mesa etching region of the second LED stack 33.

The third LED stack 43 also includes a mesa etching region, in which a portion of the second conductivity type semiconductor layer 43b is removed to expose an upper surface of the first conductivity type semiconductor layer 43a. The first LED stack 23, however, may not include a mesa etching region.

The through holes 33h1 and 33h2 may be formed through the first conductivity type semiconductor layer 33a exposed in the mesa etching region. The through holes 23h1, 23h2, 23h3, 23h4, and 23h5 may pass through the first LED stack 23, and particularly, may pass through the first and second conductivity type semiconductor layers 23a and 23b.

The third LED stack 43 according to an exemplary embodiment may have a flat lower surface, without being limited thereto. For example, in some exemplary embodiments, the third LED stack 43 may include irregularities on a surface of the first conductivity type semiconductor layer 43a, and light extraction efficiency may be improved by the irregularities. The irregularities on the surface of the first conductivity type semiconductor layer 43a may be formed by separating a patterned sapphire substrate, and additionally or alternatively by texturing the surface after separating the growth substrate. In some exemplary embodiments, the first conductivity type semiconductor layer 33a of the second LED stack 33 may also have a textured surface.

The first LED stack 23, the second LED stack 33, and the third LED stack 43 according to the illustrated exemplary embodiment may be stacked to overlap one another, and may also have substantially the same luminous area. However, the luminous area of the first LED stack 23 may be smaller than that of the second LED stack 33, and the luminous area of the second LED stack 33 may be smaller than that of the third LED stack 43, by the through holes 23h1, 23h2, 23h3, 23h4, and 23h5 and the through holes 33h1 and 33h2. In addition, a side surface of the light emitting device 100 may be inclined, such that a width of the light emitting device 100 may be gradually increasing from the first LED stack 23 to the third LED stack 43. As such, the luminous area of the third LED stack 43 may be larger than that of the first LED stack 23. An inclination angle of the side surface of the light emitting device 100 with respect to the upper surface of the third LED stack 43 may be about 75 degrees to about 90 degrees. When the inclination angle is less than 75 degrees, the luminous area of the first LED stack 23 may become too small, and thus, it may be difficult to reduce a size of the light emitting device 100.

The first transparent electrode 25 is disposed between the first LED stack 23 and the second LED stack 33. The first transparent electrode 25 is in ohmic contact with the second conductivity type semiconductor layer 23b of the first LED stack 23, and transmits light generated by the first LED stack 23. The first transparent electrode 25 may be formed using a transparent oxide layer or a metal layer, such as indium tin oxide (ITO). The first transparent electrode 25 may cover substantially the entire surface of the second conductivity type semiconductor layer 23b of the first LED stack 23, and a side surface thereof may be flush with a side surface of the first LED stack 23. More particularly, the side surface of the first transparent electrode 25 may not be covered with the second bonding layer 59. Furthermore, the through holes 23h1, 23h2, 23h3, and 23h4 may pass through the first transparent electrode 25, and thus, the first transparent electrode 25 may be exposed by the sidewalls of the through holes 23h1, 23h2, 23h3, and 23h4. Meanwhile, the through hole 23h5 exposes an upper surface of the first transparent electrode 25. However, the inventive concepts are not limited thereto, and in some exemplary embodiments, the first transparent electrode 25 may be partially removed along an edge of the first LED stack 23, and thus, at least a portion of the side surface of the first transparent electrode 25 may be covered with the second bonding layer 59. In addition, when the first transparent electrode 25 is previously patterned and removed in a region where the through holes 23h1, 23h2, 23h3, and 23h4 are formed according to other exemplary embodiments, the first transparent electrode 25 may not be exposed by the sidewalls of the through holes 23h1, 23h2, 23h3, and 23h4.

The second transparent electrode 35 is in ohmic contact with the second conductivity type semiconductor layer 33b of the second LED stack 33. As shown in the drawings, the second transparent electrode 35 contacts the upper surface of the second LED stack 33 between the first LED stack 23 and the second LED stack 33. The second transparent electrode 35 may be formed of a metal layer or a conductive oxide layer that is transparent to red light, for example. The conductive oxide layer may include $SnO_2$, $InO_2$, ITO, ZnO, IZO, or the like. In particular, the second transparent electrode 35 may be formed of ZnO, which may be formed as a single crystal on the second LED stack 33. In this manner, the ZnO may have favorable electrical and optical characteristics as compared with the metal layer or other conductive oxide layers. In particular, ZnO has a strong bonding force to the second LED stack 33, and remains undamaged even when the growth substrate is separated during manufacture, such as through a laser lift-off process.

The second transparent electrode 35 may be partially removed along an edge of the second LED stack 33. As such, an outer side surface of the second transparent electrode 35 is not exposed to the outside, but is covered with the lower insulation layer 51. In particular, the side surface of the second transparent electrode 35 is recessed inwardly than that of the second LED stack 33, and a region where the second transparent electrode 35 is recessed is filled with the lower insulation layer 51 and/or the second bonding layer 59. The second transparent electrode 35 may also be recessed near the mesa etching region of the second LED stack 33, and the recessed region may be filled with the lower insulation layer 51 or the second bonding layer 59.

The third transparent electrode 45 is in ohmic contact with the second conductivity type semiconductor layer 43b of the third LED stack 43. The third transparent electrode 45 may be disposed between the second LED stack 33 and the third LED stack 43, and contacts the upper surface of the third LED stack 43. The third transparent electrode 45 may be formed of a metal layer or a conductive oxide layer that is transparent to red light and green light, for example. The conductive oxide layer may include $SnO_2$, $InO_2$, ITO, ZnO, IZO, or the like. In particular, the third transparent electrode 45 may be formed of ZnO, which may be formed as a single crystal on the third LED stack 43. In this manner, ZnO may have favorable electrical and optical characteristics as compared with the metal layer or other conductive oxide layers. In particular, ZnO has a strong bonding force to the third LED stack 43, and remains undamaged even when the growth substrate is separated during manufacture, such as through a laser lift-off process.

The third transparent electrode 45 may be partially removed along an edge of the third LED stack 43. As such, an outer side surface of the third transparent electrode 45 is not exposed to the outside, but is covered with the first bonding layer 49. In particular, the side surface of the third transparent electrode 45 is recessed inwardly than that of the third LED stack 43, and a region where the third transparent electrode 45 is recessed is filled with the first bonding layer 49. The third transparent electrode 45 is also recessed near the mesa etching region of the third LED stack 43, and the recessed region is filled with the first bonding layer 49.

When the second transparent electrode 35 and the third transparent electrode 45 are recessed as described above, the side surfaces of the second transparent electrode 35 and the third transparent electrode 45 may be prevented from being exposed to an etching gas, thereby improving the production yield of the light emitting device 100.

According to an exemplary embodiment, the second transparent electrode 35 and the third transparent electrode 45 may be formed of the same kind of conductive oxide layer, for example, ZnO, and the first transparent electrode 25 may be formed of a different kind of conductive oxide layer from the second and third transparent electrodes 35 and 45, such as ITO. However, the inventive concepts are not limited thereto, and each of the first, second, and third transparent electrodes 25, 35, and 45 may include substantially the same material, or at least one may include a different material.

The n-electrode pad 47a is in ohmic contact with the first conductivity type semiconductor layer 43a of the third LED stack 43. The n-electrode pad 47a may be disposed on the first conductivity type semiconductor layer 43a exposed through the second conductivity type semiconductor layer 43b, that is, in the mesa etching region. The n-electrode pad 47a may be formed of, for example, Cr/Au/Ti. An upper surface of the n-electrode pad 47a may be placed higher than that of the second conductivity type semiconductor layer 43b, and further, higher than that of the third transparent electrode 45. For example, a thickness of the n-electrode pad 47a may be about 2 μm or more. The n-electrode pad 47a may have a shape of a truncated cone, but is not limited thereto. In some exemplary embodiments, the n-electrode pad 47a may have various shapes, such as a truncated pyramid, a cylindrical shape, or a square cylindrical shape.

The lower p-electrode pad 47b may include substantially the same material as the n-electrode pad 47a. An upper surface of the lower p-electrode pad 47b is located at substantially the same elevation as an upper surface of the n-electrode pad 47a, and, accordingly, a thickness of the lower p-electrode pad 47b may be less than that of the n-electrode pad 47a. More particularly, the thickness of the lower p-electrode pad 47b may be approximately equal to a thickness of a portion of the n-electrode pad 47a protruding above the second transparent electrode 45. For example, the thickness of the lower p-electrode pad 47b may be about 1.2 μm or less. Since the upper surface of the lower p-electrode pad 47b is located at substantially the same elevation as that of the n-electrode pad 47a, the lower p-electrode pad 47b and the n-electrode pad 47a may be simultaneously exposed when the through holes 33h1 and 33h2 are formed. When the elevations of the n-electrode pad 47a and the lower p-electrode pad 47b are different, any one of the electrode pads may be damaged in the etching process. As such, the elevations of the n-electrode pad 47*a* and the lower p-electrode pad 47*b* are set to be approximately equal to prevent any one of the electrode pads from being damaged during the etching process or the like.

The first bonding layer 49 couples the second LED stack 33 to the third LED stack 43. The first bonding layer 49 may couple the first conductivity type semiconductor layer 33*a* and the third transparent electrode 45 therebetween. The first bonding layer 49 may partially contact the second conductivity type semiconductor layer 43*b*, and may partially contact the first conductivity type semiconductor layer 43*a* exposed by the mesa etching region. In addition, the first bonding layer 49 may cover the n-electrode pad 47*a* and the lower p-electrode pad 47*b*.

The first bonding layer 49 may be formed of a transparent organic material layer, or may be formed of a transparent inorganic material layer. For example, the organic material layer may include SUB, poly methylmethacrylate (PMMA), polyimide, parylene, benzocyclobutene (BCB), or the like, and the inorganic material layer may include $Al_2O_3$, $SiO_2$, $SiN_x$, or the like. In addition, the first bonding layer 30 may be formed of spin-on-glass (SOG).

The upper p-electrode pad 37*b* may be disposed on the second transparent electrode 35. As shown in FIG. 3 and FIG. 4B, the upper p-electrode pad 37*b* may be covered with the lower insulation layer 51. The upper p-electrode pad 37*b* may be formed of Ni/Au/Ti, for example, and may be formed to have a thickness of about 2 μm.

The lower insulation layer 51 is formed on the second LED stack 33, and covers the second transparent electrode 35. The lower insulation layer 51 may also cover the mesa etching region of the second LED stack 33 to provide a flat upper surface. The lower insulation layer 51 may be formed of $SiO_2$, for example.

The through hole 33*h*1 and the through hole 33*h*2 expose the n-electrode pad 47*a* and the lower p-electrode pad 47*b* through the lower insulation layer 51, the second LED stack 33, and the first bonding layer 49, respectively. As described above, the through holes 33*h*1 and 33*h*2 may be formed in the mesa etching region. Meanwhile, as shown in FIG. 4B, a through hole 51*h* exposes the first conductivity type semiconductor layer 33*a* through the lower insulation layer 51.

The first sidewall insulation layer 53 covers sidewalls of the through holes 33*h*1, 33*h*2, and 51*h*, and has openings exposing bottoms of the through holes 33*h*1, 33*h*2, and 51*h*. The first sidewall insulation layer 53 may be formed using, for example, a chemical vapor deposition technique or an atomic layer deposition technique, and may be formed of, for example, $Al_2O_3$, $SiO_2$, $Si_3N_4$, or the like.

The lower buried layers 55*cb*, 55*b*, and 55*cg* may substantially fill the through holes 33*h*1, 33*h*2, and 51*h*, respectively. The lower buried layers 55*cb* and 55*b* are insulated from the second LED stack 33 by the first sidewall insulation layer 53. The lower buried layer 55*cb* may be electrically connected to the n-electrode pad 47*a*, the lower buried layer 55*b* may be electrically connected to the lower p-electrode pad 47*b*, and the lower buried layer 55*cg* may be electrically connected to the first conductivity type semiconductor layer 33*a* of the second LED stack 33.

The lower buried layers 55*cb*, 55*b*, and 55*cg* may be formed using a chemical mechanical polishing technique. For example, after forming a seed layer and filling the through holes 33*h*1, 33*h*2, and 51*h* using a plating technique, the lower buried layers 55*cb*, 55*b*, and 55*cg* may be formed by removing metal layers on the lower insulation layer 51 using the chemical mechanical polishing technique. Furthermore, a metal barrier layer may be formed before forming the seed layer.

The lower buried layers 55*cb*, 55*b*, and 55*cg* may be formed together through the same process. Accordingly, upper surfaces of the lower buried layers 55*cb*, 55*b*, and 55*cg* may be substantially flush with the lower insulation layer 51. However, the inventive concepts are not limited to the illustrated exemplary embodiment, and in some exemplary embodiments, each of the lower buried layers 55*cb*, 55*b*, and 55*cg* may be formed through different processes from one another.

The second bonding layer 59 couples the first LED stack 23 to the second LED stack 33. As shown in the drawing, the second bonding layer 59 may be disposed between the first transparent electrode 25 and the lower insulation layer 51. The second bonding layer 59 may include substantially the same material that may form the first bonding layer 49 described above, and thus, repeated descriptions thereof will be omitted to avoid redundancy.

The intermediate insulation layer 61 covers the first LED stack 23. The intermediate insulation layer 61 may be formed of an aluminum oxide film, a silicon oxide film, or a silicon nitride film, and may be formed to have, for example, a thickness of about 800 nm.

The through holes 23*h*1, 23*h*2, 23*h*3, 23*h*4, and 23*h*5 pass through the first LED stack 23. The through hole 23*h*5 is formed to provide a passage for allowing electrical connection to the first transparent electrode 25. Further, the through hole 23*h*1 is formed to provide a passage for allowing electrical connection to the lower buried layer 55*cb*, the through hole 23*h*2 is formed to provide a passage for allowing electrical connection to the lower buried layer 55*b*, the through hole 23*h*3 is formed to provide a passage for allowing electrical connection to the upper p-electrode pad 37*b*, and the through hole 23*h*4 is formed to provide a passage for allowing electrical connection to the lower buried layer 55*cg*.

In the illustrated exemplary embodiment, the through hole 23*h*1 may expose the upper surface of the lower buried layer 55*cb*, the through hole 23*h*2 may expose the upper surface of the lower buried layer 55*b*, the through hole 23*h*3 may expose the upper p-electrode pad 37*b*, and the through hole 23*h*4 may expose the upper surface of the lower buried layer 55*cg*.

The through hole 23*h*5 is formed to provide a passage for allowing electrical connection to the first transparent electrode 25. The through hole 23*h*5 does not pass through the first transparent electrode 25. However, the inventive concepts are not limited thereto, and in some exemplary embodiments, the through hole 23*h*1 may pass through the first transparent electrode 25, as long as the through hole 23*h*1 provides the passage for electrical connection to the first transparent electrode 25.

The through holes 23*h*1, 23*h*2, 23*h*3, and 23*h*4 may pass through the first LED stack 23, and may also pass through the intermediate insulation layer 61, the first transparent electrode 25, and the second bonding layer 59. Furthermore, the through hole 23*h*3 may pass through the lower insulation layer 51.

The through hole 61*h* may expose the first conductivity type semiconductor layer 23*a* of the first LED stack 23 through the intermediate insulation layer 61.

The second sidewall insulation layer 63 covers sidewalls of the through holes 23*h*1, 23*h*2, 23*h*3, 23*h*4, 23*h*5, and 61*h*, and has openings exposing bottoms of the through holes 23*h*1, 23*h*2, 23*h*3, 23*h*4, 23*h*5, and 61*h*. The second sidewall insulation layer 63 may be formed using, for example, a chemical vapor deposition technique or an atomic layer deposition technique, and may be formed of, for example, $Al_2O_3$, $SiO_2$, $Si_3N_4$, or the like.

The upper buried layers 65cb, 65b, 65g, 65cg, 65r, and 65cr may substantially fill the through holes 23h1, 23h2, 23h3, 23h4, 23h5, and 61h, respectively. The upper buried layers 65cb, 65b, 65g, 65cg, and 65r are electrically insulated from the first LED stack 23 by the second sidewall insulation layer 63.

The upper buried layer 65cb is electrically connected to the lower buried layer 55cb, the upper buried layer 65b is electrically connected to the lower buried layer 55b, and the upper buried layer 65g is electrically connected to the upper p-electrode pad 37b, and the upper buried layer 65cg is electrically connected to the lower buried layer 55cg. The upper buried layer 65r may be electrically connected to the first transparent electrode 25, and the upper buried layer 65cg may be electrically connected to the first conductivity type semiconductor layer 23a of the first LED stack 23.

The upper buried layers 65cb, 65b, 65g, 65cg, 65r, and 65cr may be formed using a chemical mechanical polishing technique. For example, after forming a seed layer and filling the through holes 23h1, 23h2, 23h3, 23h4, 23h5, and 61h using a plating technique, the upper buried layers 65cb, 65b, 65g, 65cg, 65r, and 65cr may be formed by removing metal layers on the intermediate insulation layer 61 using the chemical mechanical polishing technique. Furthermore, a metal barrier layer may be formed before forming the seed layer.

The upper buried layers 65cb, 65b, 65g, 65cg, 65r, and 65cr may be formed together through the same process. Accordingly, upper surfaces of the upper buried layers 65cb, 65b, 65g, 65cg, 65r, and 65cr may be substantially flush with the intermediate insulation layer 61. However, the inventive concepts are not limited to the illustrated exemplary embodiment, and in some exemplary embodiments, the upper buried layers 65cb, 65b, 65g, 65cg, 65r, and 65cr may be formed through different processes from one another.

The first upper connector 67r, the second upper connector 67g, the third upper connector 67b, and the upper common connector 67c are disposed on the intermediate insulation layer 61. The first upper connector 67r is electrically connected to the upper buried layer 65r, the second upper connector 67g is electrically connected to the upper buried layer 65g, and the third upper connector 67b is electrically connected to the upper buried layer 65b. Meanwhile, the upper common connector 67c is commonly electrically connected to the upper buried layers 65cb, 65cg, and 65cr. More particularly, the upper buried layers 65cb, 65cg, and 65cr are electrically connected to one another by the upper common connector 67c, and thus, the first conductivity type semiconductor layers 23a, 33a, and 43a of the first, second, and third LED stacks 23, 33, and 43 are electrically connected to one another.

The first upper connector 67r, the second upper connector 67g, the third upper connector 67b, and the upper common connector 67c may be formed of substantially the same material, for example, AuGe/Ni/Au/Ti, in the same process. In this case, AuGe may be in ohmic contact with the first conductivity type semiconductor layer 23a. AuGe may be formed to have a thickness of about 100 nm, and Ni/Au/Ti may be formed to have a thickness of about 2 μm. In some exemplary embodiments, AuTe may replace AuGe.

The upper insulation layer 71 covers the intermediate insulation layer 61, and covers the first upper connector 67r, the second upper connector 67g, the third upper connector 67b, and the upper common connector 67c. The upper insulation layer 71 may also cover side surfaces of the first, second, and third LED stacks 23, 33, and 43. The upper insulation layer 71 may have openings 71a exposing the first upper connector 67r, the second upper connector 67g, the third upper connector 67b, and the upper common connector 67c. The openings 71a of the upper insulation layer 71 may be generally disposed on flat surfaces of the first upper connector 67r, the second upper connector 67g, the third upper connector 67b, and the upper common connector 67c. The upper insulation layer 71 may be formed of a silicon oxide film or a silicon nitride film, and may be formed thinner than the intermediate insulation layer 61, for example, about 400 nm thick.

Each of the bump pads 73r, 73g, 73b, and 73c may be disposed on the first upper connector 67r, the second upper connector 67g, and the third upper connector 67b, and the upper common connector 67c in the openings 71a of the upper insulation layer 71 and electrically connected thereto.

The first bump pad 73r may be electrically connected to the second conductivity type semiconductor layer 23b of the first LED stack 23 through the first upper connector 67r and the first transparent electrode 25.

The second bump pad 73g may be electrically connected to the second conductivity type semiconductor layer 33b of the second LED stack 33 through the second upper connector 67g, the upper buried layer 65g, the upper p-electrode pad 37b, and the second transparent electrode 35.

The third bump pad 73b may be electrically connected to the second conductivity type semiconductor layer 43b of the LED stack 43 through the third upper connector 67b, the upper buried layer 65b, the lower buried layer 55b, the lower p-electrode pad 47b, and the third transparent electrode 45.

The common bump pad 73c may be electrically connected to the upper buried layers 65cb, 65cg, and 65cr through the upper common connector 67c, and accordingly, the common bump pad 73c is electrically connected to the first conductivity type semiconductor layers 23a, 33a, and 43a of the first, second, and third LED stacks 23, 33, and 43.

As such, each of the first, second, and third bump pads 73r, 73g, and 73b may be electrically connected to the second conductivity type semiconductor layers 23b, 33b, and 43b of the first, second, and third LED stacks 23, 33, and 43, and the common bump pad 73c may be commonly electrically connected to the first conductivity type semiconductor layers 23a, 33a, and 43a of the first, second, and third LED stacks 23, 33, and 43.

The bump pads 73r, 73g, 73b, and 73c may be disposed in the openings 71a of the upper insulation layer 71, and upper surfaces of the bump pads 73r, 73g, 73b, and 73c may be substantially flat. The bump pads 73r, 73g, 73b, and 73c may be disposed on the flat surfaces of the first, second, and third upper connectors 67r, 67g, and 67b, and the upper common connector 67c. The bump pads 73r, 73g, 73b, and 73c may be formed of Au or Au/In. For example, Au may be formed to have a thickness of about 3 μm, and In may be formed to have a thickness of about 1 μm. According to an exemplary embodiment, the light emitting device 100 may be bonded to the pads of the circuit board 101 using Au or In. However, the inventive concepts are not limited thereto, and in some exemplary embodiments, the light emitting device 100 may be bonded to the pads using Pb or AuSn of the bump pads.

In the illustrated exemplary embodiment, the upper surfaces of the bump pads 73r, 73g, 73b, and 73c are described and illustrated as being flat, but the inventive concepts are not limited thereto. For example, in some exemplary embodiments, the bump pads 73r, 73g, 73b, and 73c may have irregular upper surfaces, and some of the bump pads may be disposed on the upper insulation layer 71.

According to the illustrated exemplary embodiment, the first LED stack 23 is electrically connected to the bump pads 73r and 73c, the second LED stack 33 is electrically connected to the bump pads 73g and 73c, and the third LED stack 43 is electrically connected to the bump pads 73b and 73c. Accordingly, cathodes of the first LED stack 23, the second LED stack 33, and the third LED stack 43 are electrically connected to the common bump pad 73c, and anodes thereof are electrically connected to the first, second, and third bump pads 73r, 73g, and 73b, respectively. Accordingly, the first, second, and third LED stacks 23, 33, and 43 may be driven independently.

In the illustrated exemplary embodiment, the light emitting device 100 is described as including the bump pads 73r, 73g, 73b, and 73c, however, in some exemplary embodiments, the bump pads may be omitted. In particular, when bonding to a circuit board 101 using an anisotropic conductive film or an anisotropic conductive paste, the bump pads may be omitted, and the upper connectors 67r, 67g, 67b, and 67c may be directly bonded to the pads of the circuit board 101 to increase a bonding area.

Figure 5A:
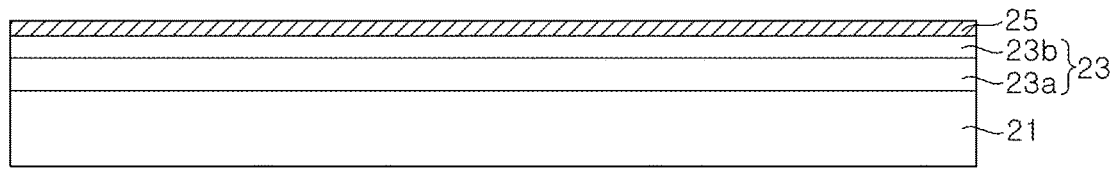
FIGS. 5A, 5B, and FIG. 5C are schematic cross-sectional views illustrating first, second, and third LED stacks grown on a growth substrate, respectively, according to an exemplary embodiment.
Figure 5B:
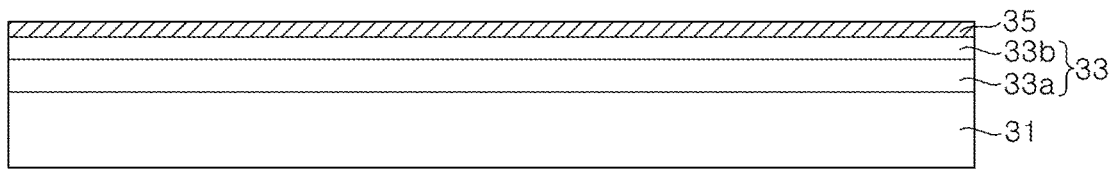
Figure 5C:
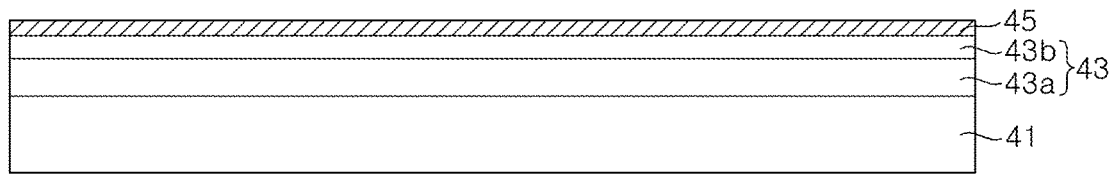

Hereinafter, a method of manufacturing the light emitting device 100 will be described in detail. A structure of the light emitting device 100 will be further described through the method of manufacturing the light emitting device 100 described below. FIG. 5A, FIG. 5B, and FIG. 5C are schematic cross-sectional views illustrating the first, second, and third LED stacks grown on growth substrates, respectively, according to an exemplary embodiment.

First, referring to FIG. 5A, a first LED stack 23 including a first conductivity type semiconductor layer 23a and a second conductivity type semiconductor layer 23b is grown on a first substrate 21. An active layer may be interposed between the first conductivity type semiconductor layer 23a and the second conductivity type semiconductor layer 23b.

The first substrate 21 may be a substrate capable of growing the first LED stack 23 thereon, such as a GaAs substrate. The first conductivity type semiconductor layer 23a and the second conductivity type semiconductor layer 23b may be formed of an AlGaInAs-based or AlGaInP-based semiconductor layer, and the active layer may include, for example, an AlGaInP-based well layer. A composition ratio of AlGaInP may be determined so that the first LED stack 23 emits red light, for example.

A first transparent electrode 25 may be formed on the second conductivity type semiconductor layer 23b. As described above, the first transparent electrode 25 may be formed of a metal layer or a conductive oxide layer that transmits light generated by the first LED stack 23, for example, red light. The first transparent electrode 25 may be formed of, for example, indium-tin oxide (ITO).

Referring to FIG. 5B, a second LED stack 33 including a first conductivity type semiconductor layer 33a and a second conductivity type semiconductor layer 33b is grown on a second substrate 31. An active layer may be interposed between the first conductivity type semiconductor layer 33a and the second conductivity type semiconductor layer 33b.

The second substrate 31 may be a substrate capable of growing the second LED stack 33 thereon, such as a sapphire substrate, a GaN substrate, or a GaAs substrate. The first conductivity type semiconductor layer 33a and the second conductivity type semiconductor layer 33b may be formed of an AlGaInAs-based or AlGaInP-based semiconductor layer, an AlGaInN-based semiconductor layer, and the active layer may include, for example, an AlGaInP-based well layer or AlGaInN-based well layer. A composition ratio of AlGaInP or AlGaInN may be determined so that the second LED stack 33 emits green light, for example.

A second transparent electrode 35 may be formed on the second conductivity type semiconductor layer 33b. As described above, the second transparent electrode 35 may be formed of a metal layer or a conductive oxide layer that transmits light generated by the first LED stack 23, for example, red light. In particular, the second transparent electrode 35 may be formed of ZnO.

Referring to FIG. 5C, a third LED stack 43 including a first conductivity type semiconductor layer 43a and a second conductivity type semiconductor layer 43b is grown on a third substrate 41. An active layer may be interposed between the first conductivity type semiconductor layer 43a and the second conductivity type semiconductor layer 43b.

The third substrate 41 may be a substrate capable of growing the third LED stack 43 thereon, such as a sapphire substrate, a SiC substrate, or a GaN substrate. In an exemplary embodiment, the third substrate 41 may be a flat sapphire substrate, but may also be a patterned sapphire substrate. The first conductivity type semiconductor layer 43a and the second conductivity type semiconductor layer 43b may be formed of an AlGaInN-based semiconductor layer, and the active layer may include, for example, an AlGaInN-based well layer. A composition ratio of AlGaInN may be determined so that the third LED stack 43 emits blue light, for example.

A third transparent electrode 45 may be formed on the second conductivity type semiconductor layer 43b. As described above, the third transparent electrode 45 may be formed of a metal layer or a conductive oxide layer that transmits light generated in the first and second LED stacks 23 and 33, for example, red light and green light. In particular, the third transparent electrode 45 may be formed of ZnO.

The first, second, and third LED stacks 23, 33, and 43 are grown on the different growth substrates 21, 31, and 41, respectively, and, accordingly, the order of the manufacturing process is not particularly limited.

Hereinafter, a method of manufacturing the light emitting device 100 using the first, second, and third LED stacks 23, 33, and 43 grown on the growth substrates 21, 31, and 41 will be described. Hereinafter, although a region of a single light emitting device 100 will be mainly illustrated and described, a plurality of light emitting devices 100 may be manufactured in a batch in the same manufacturing process using the LED stacks 23, 33, and 43 grown on the growth substrates 21, 31, and 41.

FIGS. 6A, 6B, 7A, 7B, 8A, 8B, 9A, 9B, 10A, 10B, 11A, and 11B are schematic plan views and cross-sectional views illustrating the method of manufacturing the light emitting device 100 for a display according to an exemplary embodiment. Hereinafter, the cross-sectional views correspond to that taken along line A-A' in FIG. 3.

Figure 6A:
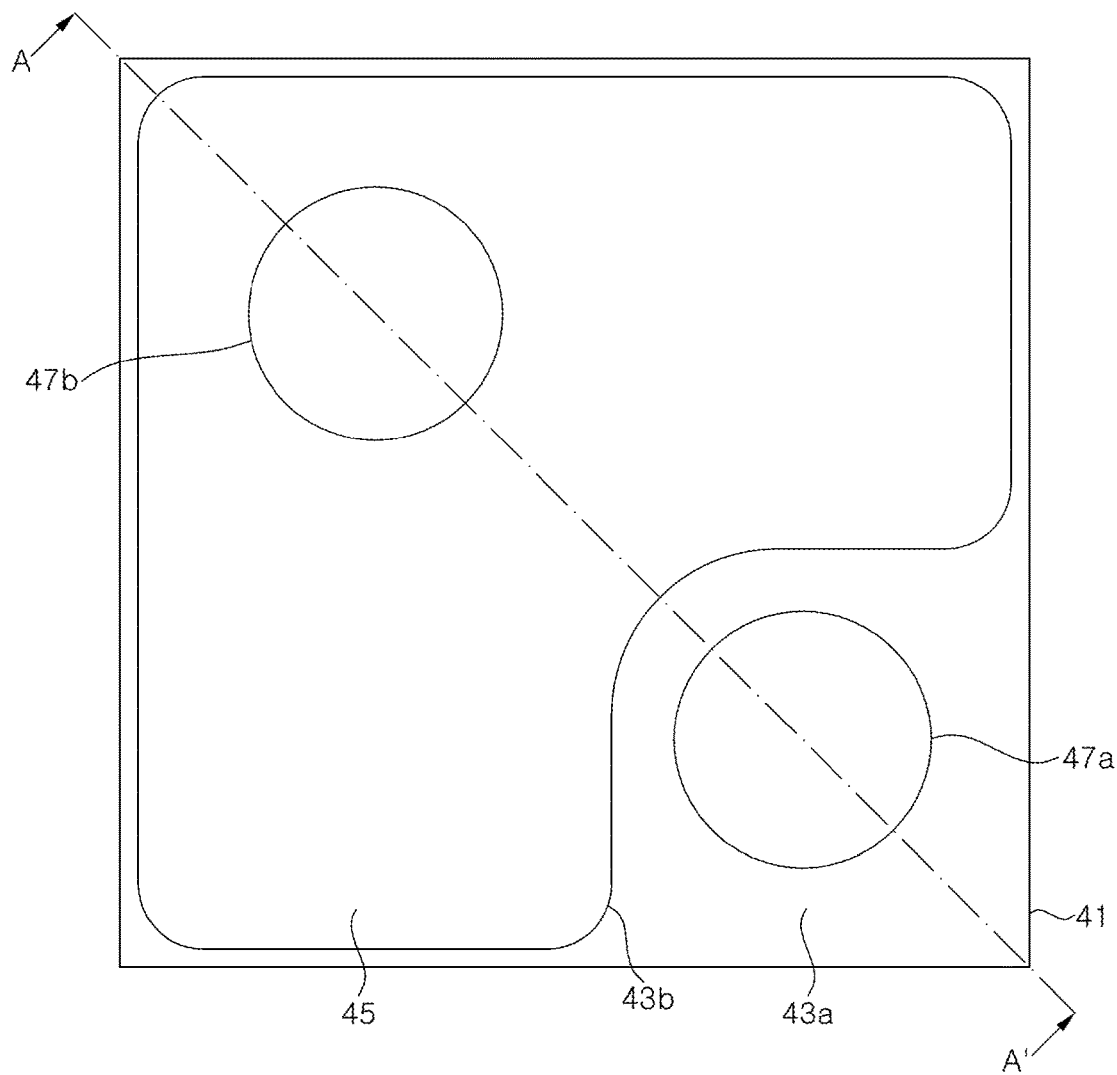
FIGS. 6A, 6B, 7A, 7B, 8A, 8B, 9A, 9B, 10A, 10B, 11A, and 11B are schematic plan views and cross-sectional views illustrating a method of manufacturing a light emitting device for a display according to an exemplary embodiment.
Figure 6B:
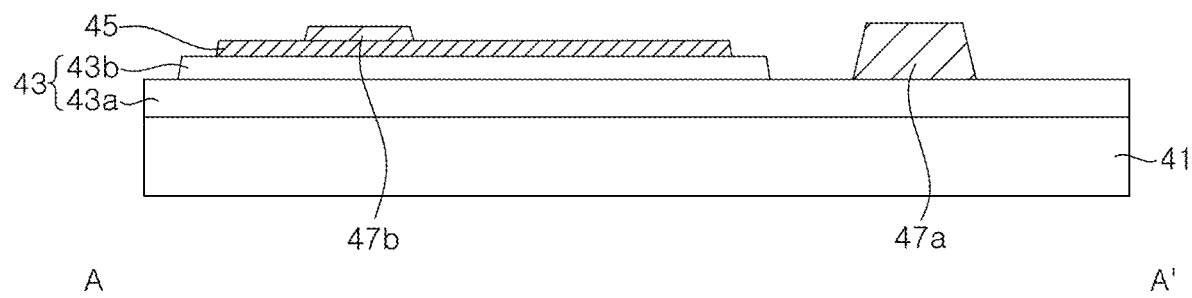

First, referring to FIG. 6A and FIG. 6B, the third transparent electrode 45 and the second conductivity type semiconductor layer 43b of the third LED stack 43 are patterned to expose the first conductivity type semiconductor layer 43a using photolithography and etching techniques. This process corresponds to, for example, a mesa etching process. A photoresist pattern may be used as an etching mask. For example, after the etching mask is formed, the third transparent electrode 45 may be etched first by a wet etching technique, and then the second conductivity type semiconductor layer 43b may be etched by a dry etching technique using the same etching mask. In this manner, the third transparent electrode 45 may be recessed from a mesa etching region. FIG. 6A exemplarily shows an edge of the mesa and does not show an edge of the third transparent electrode 45 to simplify illustration. However, since the third transparent electrode 45 is wet etched using the same etching mask, the edge of the third transparent electrode 45 may also be recessed from the edge of the mesa toward an inner side of the mesa. Since the same etching mask is used, the number of photolithography processes may not be increased, thereby reducing the process costs. However, the inventive concepts are not limited thereto, and in some exemplary embodiments, the etching mask for etching the mesa etching region may be different from the etching mask for etching the third transparent electrode 45.

Subsequently, an n-electrode pad 47a and a lower p-electrode pad 47b are formed on the first conductivity type semiconductor layer 43a and the third transparent electrode 45, respectively. The n-electrode pad 47a and the lower p-electrode pad 47b may be formed to have different thicknesses. In particular, an upper surface of the n-electrode pad 47a and that of the lower p-electrode pad 47b may be located at substantially the same elevation.

Figure 7A:
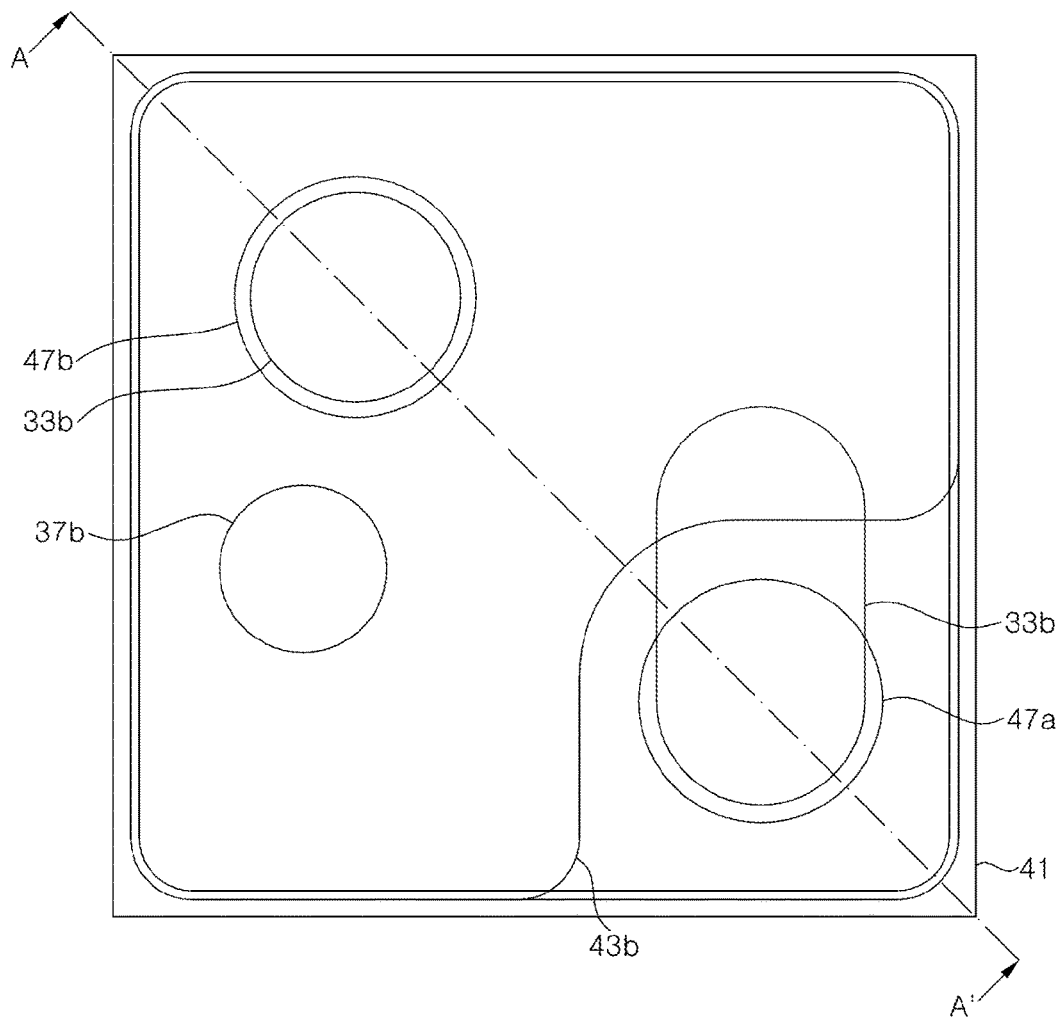
Figure 7B:
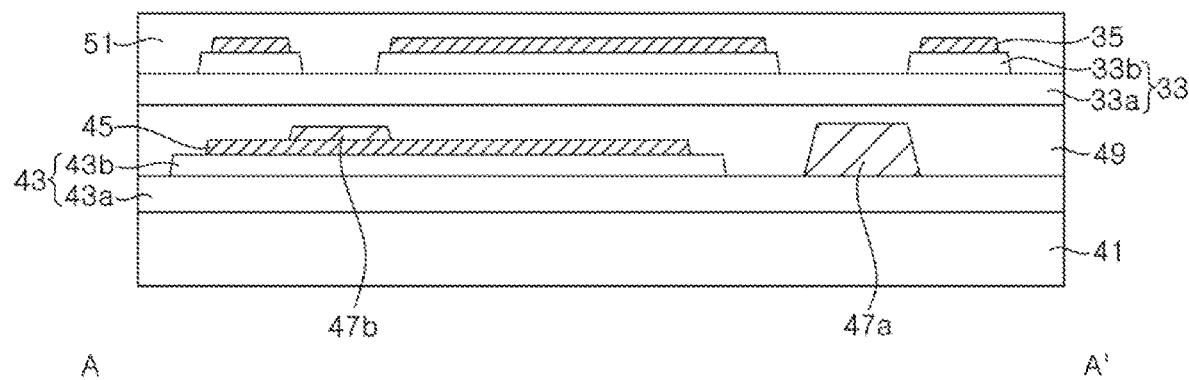

Referring to FIG. 7A and FIG. 7B, the second LED stack 33 shown in FIG. 5B is bonded onto the third LED stack 43 shown in FIG. 6A and FIG. 6B. The second LED stack 33 is bonded to a temporary substrate using a temporary bonding/debonding (TBDB) technique, and the second substrate 31 is removed from the second LED stack 33. The second substrate 31 may be removed using, for example, a laser lift off technique. After the second substrate 31 is removed, a roughened surface may be formed on a surface of the first conductivity type semiconductor layer 33a. Thereafter, the second LED stack 33 bonded to the temporary substrate may be placed to have the first conductivity type semiconductor layer 33a to face the third LED stack 43 and bonded to the third LED stack 43. The second LED stack 33 and the third LED stack 43 are bonded to each other by a first bonding layer 49. After bonding the second LED stack 33 to the third LED stack 43, the temporary substrate may be removed using a laser lift off technique. Accordingly, the second LED stack 33 may be disposed on the third LED stack 43, in which the second transparent electrode 35 may form an upper surface.

In general, when the second transparent electrode 35 is formed of ITO, ITO may be peeled from the second LED stack 33 when the second substrate 31 is removed using the laser lift off technique. As such, when the second substrate 31 is to be removed using the laser lift-off technique, the second transparent electrode 35 may include ZnO, which has a favorable bonding force.

Subsequently, the second transparent electrode 35 and the second conductivity type semiconductor layer 33b are patterned to expose the first conductivity type semiconductor layer 33a. The second transparent electrode 35 and the second conductivity type semiconductor layer 33b may be patterned by using photolithography and etching techniques. This process may be performed using the wet etching and the dry etching techniques in substantially the same manner as the mesa etching process, during which the third transparent electrode 45 and the second conductivity type semiconductor layer 43b are etched as described above.

For example, after the etching mask is formed, the second transparent electrode 35 may be etched first by the wet etching technique, and then the second conductivity type semiconductor layer 33b may be etched by the dry etching technique using the same etching mask. Accordingly, the second transparent electrode 35 may be recessed from the mesa etching region. FIG. 7A exemplarily shows an edge of the mesa, and does not show an edge of the second transparent electrode 35 to simplify illustration. However, since the second transparent electrode 35 is wet etched using the same etching mask, the edge of the second transparent electrode 35 may also be recessed from the edge of the mesa toward an inner side of the mesa. In this manner, since the same etching mask is used, the number of photolithography processes may not be increased, thereby reducing the process costs. However, the inventive concepts are not limited thereto, and in some exemplary embodiments, the etching mask for etching the mesa etching region and the etching mask for etching the second transparent electrode 35 may be different from each other.

As shown in FIG. 7A, the mesa etching region of the second LED stack 33 may be partially overlapped with that of the third LED stack 43. For example, a portion of the mesa etching region of the second LED stack 33 may be formed over the n-electrode pad 47a. In addition, another portion of the mesa etching region thereof may be disposed over the lower p-electrode pad 47b.

An upper p-electrode pad 37b, as shown in FIG. 7A may also be formed on the second transparent electrode 35.

A lower insulation layer 51, as shown in FIG. 7B, may be formed to cover the second LED stack 33 and the second transparent electrode 35. The lower insulation layer 51 may also cover the upper p-electrode pad 37b, and may provide a flat surface.

Figure 8A:
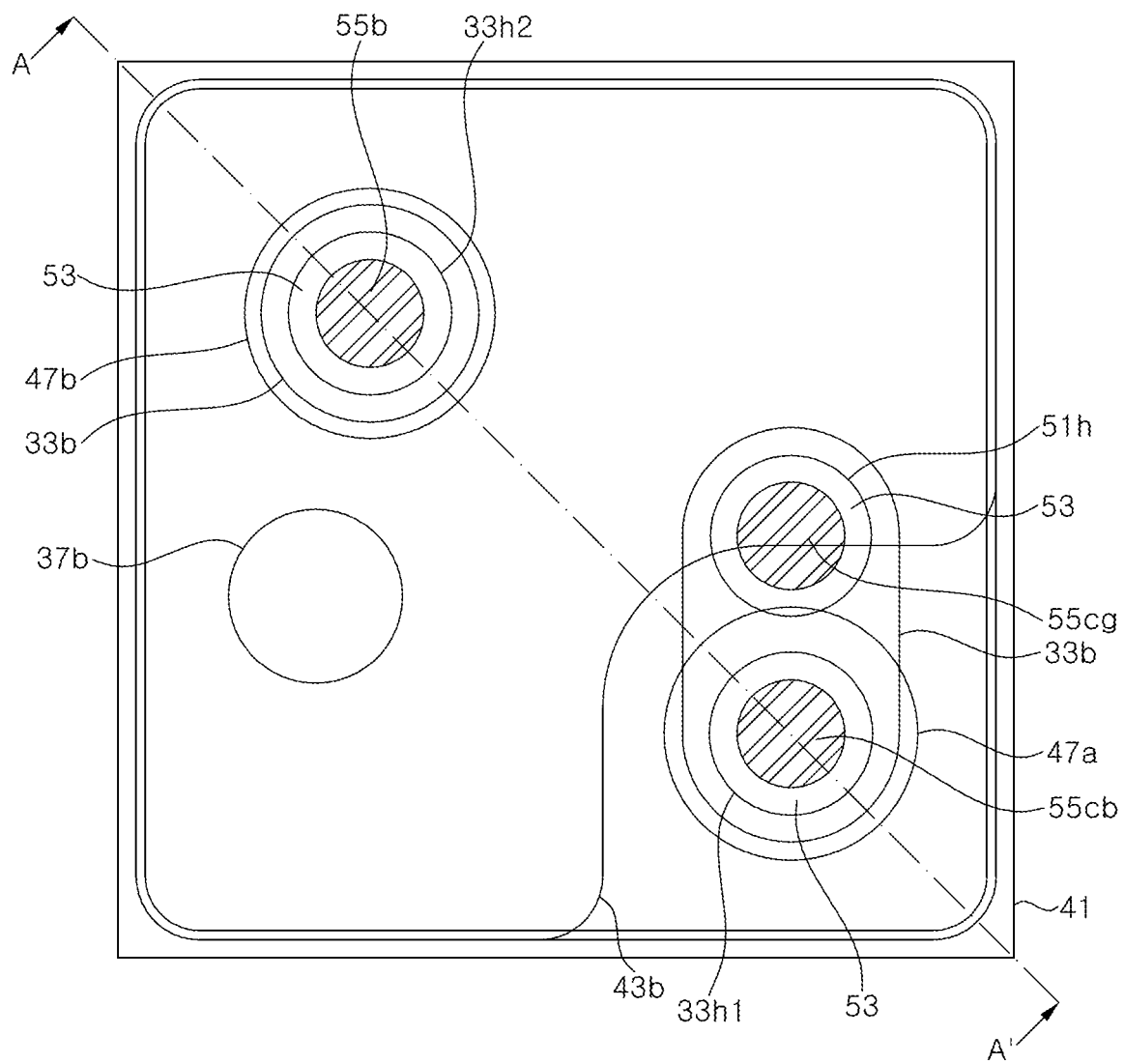
Figure 8B:
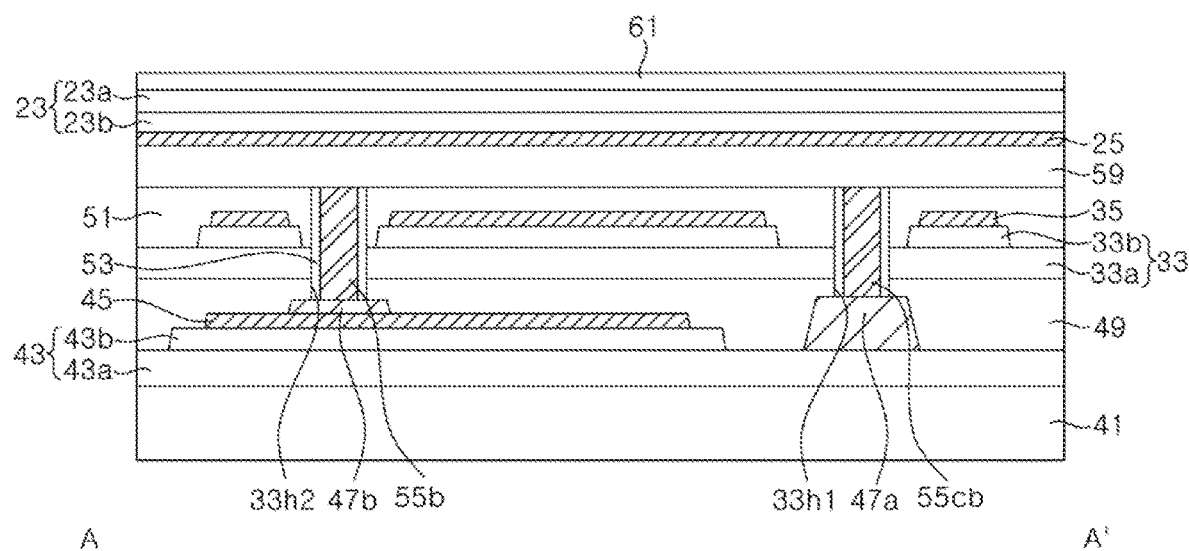

Referring to FIG. 8A and FIG. 8B, through holes 33h1 and 33h2 passing through the second LED stack 33 are formed. The through holes 33h1 and 33h2 pass through the first bonding layer 49 to expose the n-electrode pad 47a and the lower p-electrode pad 47b. The through holes 33h1 and 33h2 may be formed in the mesa etching region.

A through hole 51h exposing the first conductivity type semiconductor layer 33a of the second LED stack 33 may be formed. The through hole 51h may be located in the mesa etching region of the second conductivity type semiconductor layer 33. The through hole 51h may be formed after or before forming the through holes 33h1 and 33h2.

Subsequently, a first sidewall insulation layer 53 is formed. The first sidewall insulation layer 53 may be formed using, for example, atomic layer deposition technology. The first sidewall insulation layer 53 may cover an upper surface of the lower insulation layer 51, and may further cover sidewalls and bottom surfaces of the through holes 33h1, 33h2, and 51h. The first sidewall insulation layer 53 formed on the bottom surfaces of the through holes 33h1, 33h2, and 51h may be removed through an etching process, and thus, the n-electrode pad 47a, the lower p-electrode pad 47b, and the first conductivity type semiconductor layer 33a may be exposed.

Then, lower buried layers 55cb, 55b, and 55cg may be formed by forming a seed layer, and forming a metal layer using a plating technique in the through holes 33h1, 33h2, and 51h to substantially fill the through holes 33h1, 33h2, and 51h, and the metal layers formed on the upper surface of the lower insulation layer 51 are removed using a chemical mechanical polishing technique.

Thereafter, the first LED stack 23 of FIG. 5A is bonded to the second LED stack 33. The first LED stack 23 and the second LED stack 33 may be bonded using a second bonding layer 59, so that the first transparent electrode 25 faces the second LED stack 33. Accordingly, the second bonding layer 59 may be in contact with the first transparent electrode 25, and may also be in contact with the lower insulation layer 51 and the lower buried layers 55cb, 55b, and 55cg.

The first substrate 21 is removed from the first LED stack 23. The first substrate 21 may be removed using, for example, an etching technique. After the first substrate 21 is removed, an intermediate insulation layer 61 may be formed on a first conductivity type semiconductor layer 23a.

Figure 9A:
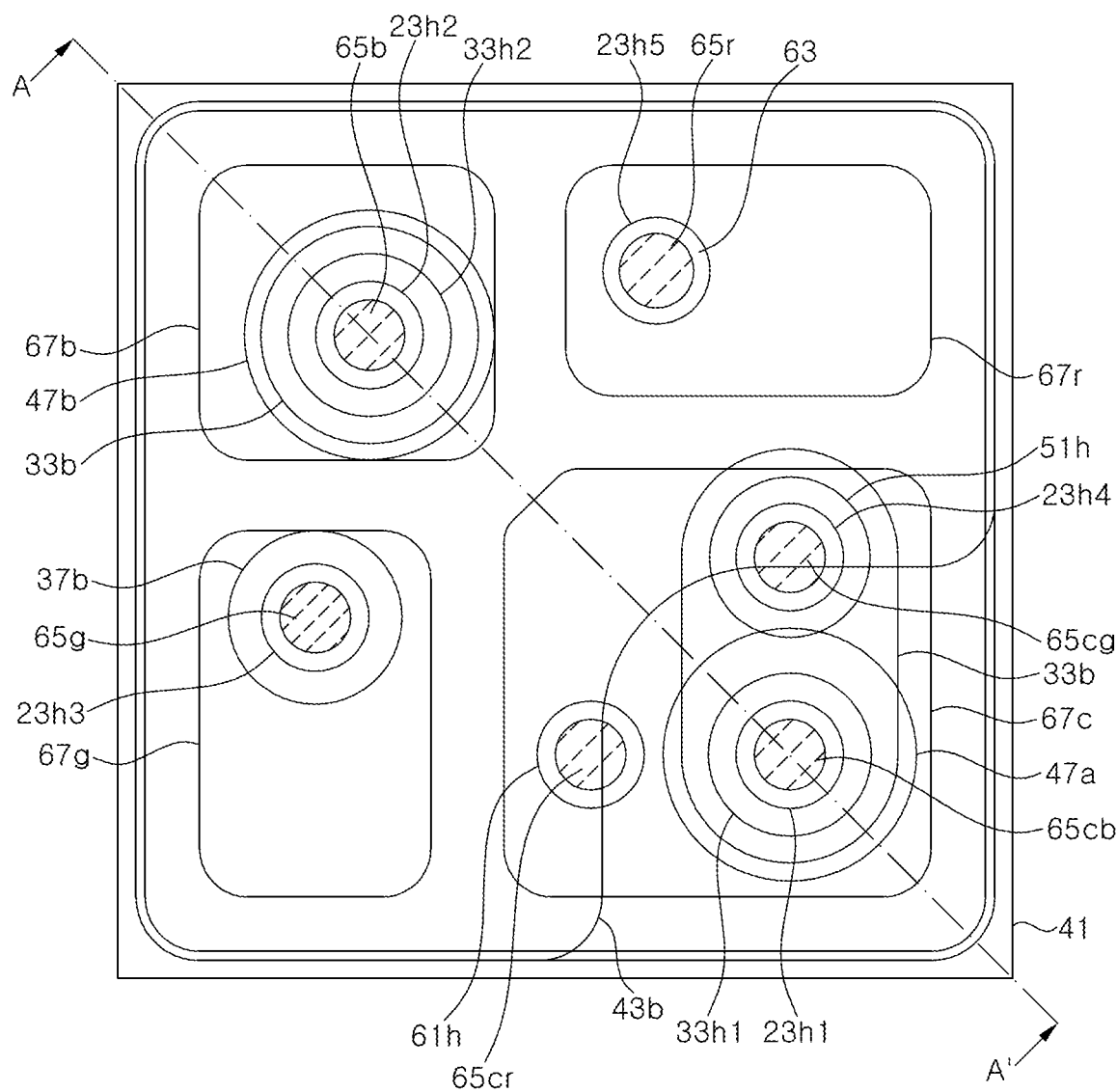
Figure 9B:
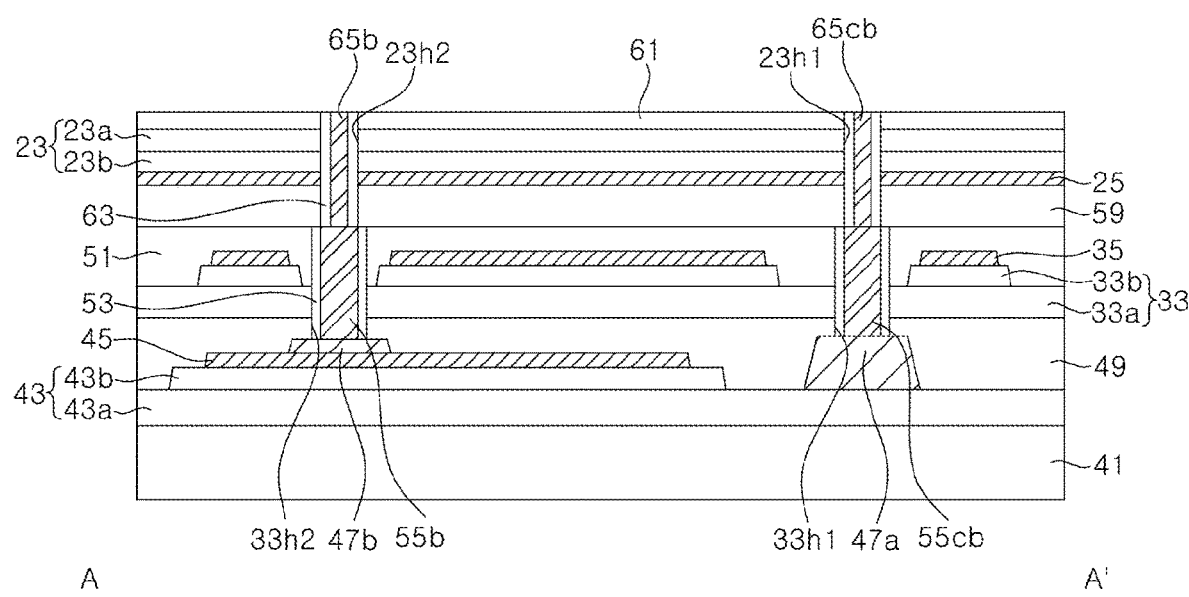

Referring to FIG. 9A and FIG. 9B, through holes 23h1, 23h2, 23h3, and 23h4 passing through the first LED stack 23 and the first transparent electrode 25 are formed. The through hole 23h1 may expose the lower buried layer 55cb, the through hole 23h2 may expose the lower buried layer 55b, the through hole 23h3 may expose the upper p-electrode pad 37b, and the through hole 23h4 may expose the lower buried layer 55cg.

In addition, a through hole 25h5 is formed. The through hole 25h5 exposes the first transparent electrode 25 through the first LED stack 23, as shown in FIG. 4C. In addition, a through hole 61h passing through the intermediate insulation layer 61 may be formed. The through hole 61h exposes the first conductivity type semiconductor layer 23a.

The through holes 23h1, 23h2, 23h3, and 23h4 may be formed together in the same process. The through holes 23h1, 23h2, 23h3, and 23h4 may pass through the intermediate insulation layer 61, the first LED stack 23, the first transparent electrode 25, and the second bonding layer 59. Furthermore, the through hole 23h3 may pass through the lower insulation layer 51.

However, since the through hole 61h and the through hole 23h5 have different etching depths from those of the through holes 23h1, 23h2, 23h3, and 23h4, the through hole 61h and the through hole 23h5 may be formed through a different process from the process forming the through holes 23h1, 23h2, 23h3, and 23h4. The through hole 61h and the through hole 23h5 may also be formed through different processes from each other.

Subsequently, upper buried layers 65cb, 65b, 65g, 65cg, 65r, and 65cr filling the through holes 23h1, 23h2, 23h3, 23h4, 25h5, and 61h are formed. To form the upper buried layers 65cb, 65b, 65g, 65cg, 65r, and 65cr, a second sidewall insulation layer 63 may be formed to cover sidewalls of the through holes 23h1, 23h2, 23h3, 23h4, 23h5, 61h, a seed layer and a metal plating layer may be formed therein, and the metal layers on the intermediate insulation layer 61 may be removed using a chemical mechanical polishing technique. A metal barrier layer may be further formed before forming the seed layer. A process of forming the upper buried layers 65cb, 65b, 65g, 65cg, 65r, and 65cr is substantially similar to that of forming the lower buried layers 55cb, 55b, and 55cg described above, and thus, repeated descriptions thereof will be omitted.

Figure 10A:
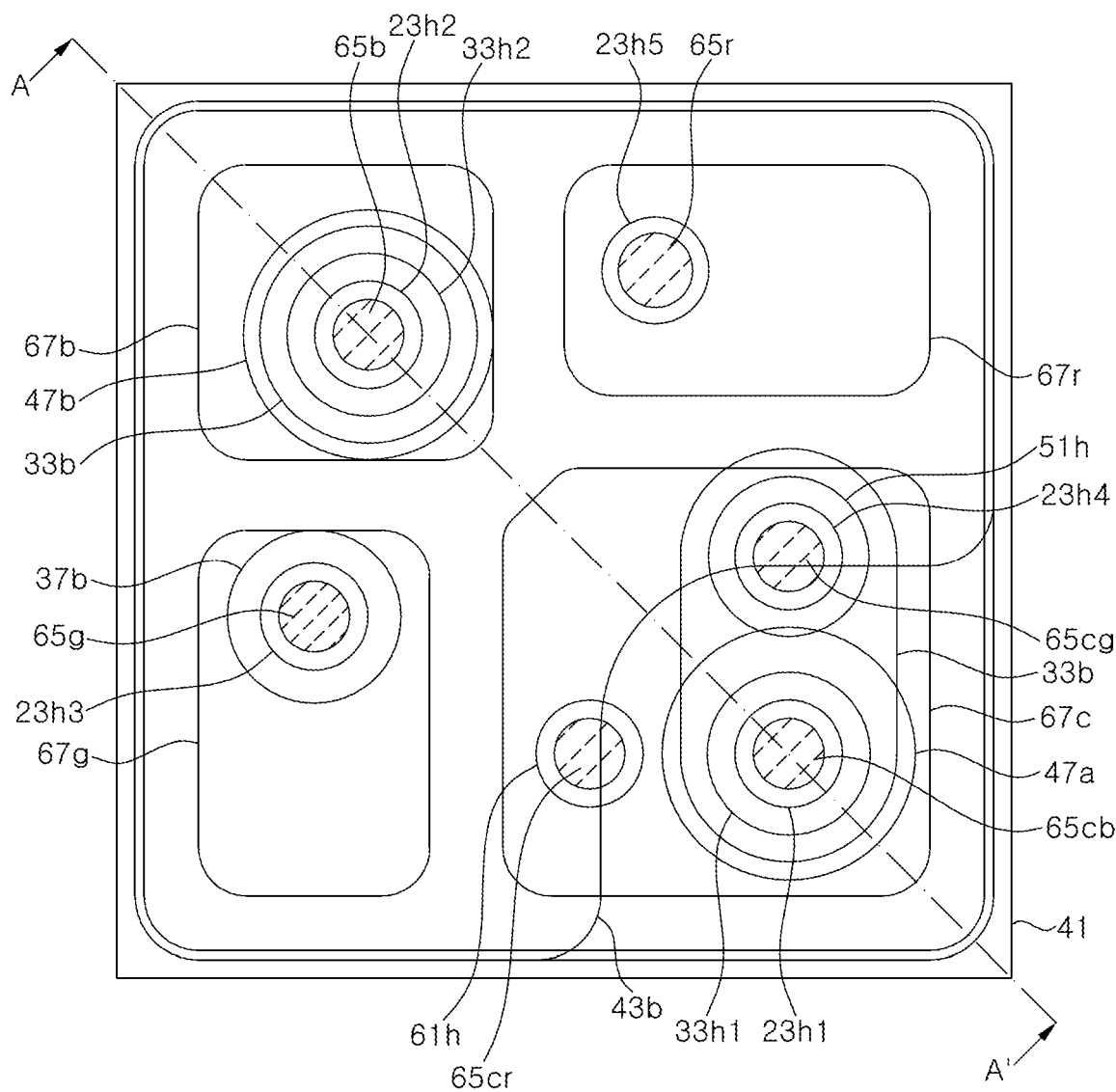
Figure 10B:
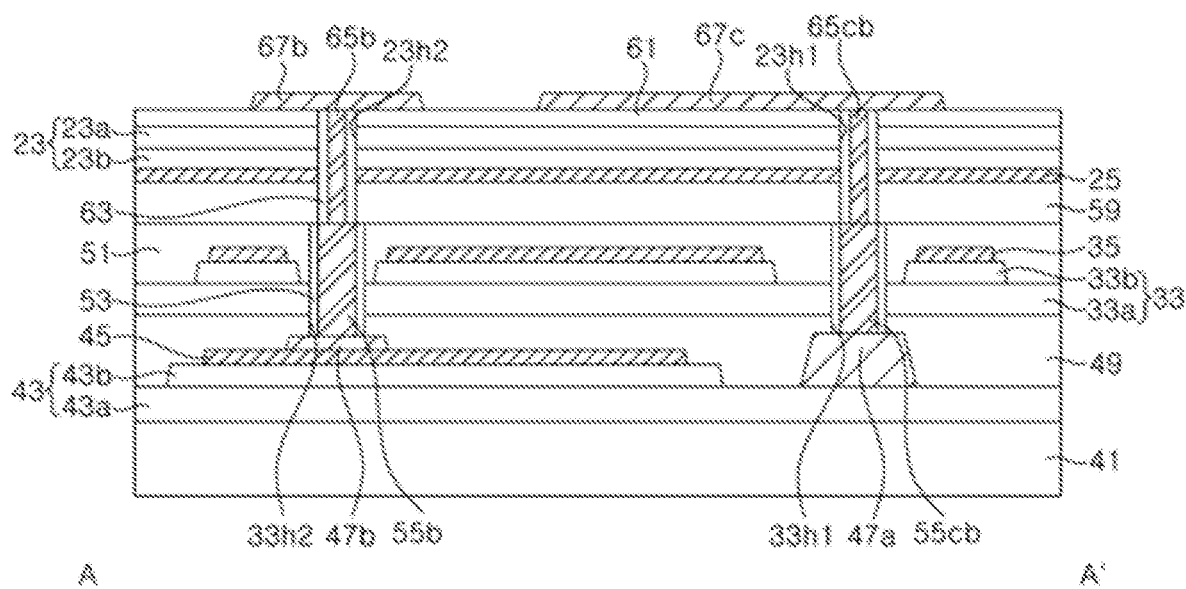

Referring to FIG. 10A and FIG. 10B, first, second, and third upper connectors 67r, 67g, and 67b and an upper common connector 67c are formed on the intermediate insulation layer 61. The first upper connector 67r is electrically connected to the upper buried layer 65r, the second upper connector 67g is electrically connected to the upper buried layer 65g, and the third upper connector 67b is electrically connected to the upper buried layer 65b. The upper common connector 67c is electrically connected to the upper buried layers 65cb, 65cg, and 65cr.

As such, the first, second, and third upper connectors 67r, 67g, and 67b are electrically connected to the second conductivity type semiconductor layers 23b, 33b, and 43b of the first, second, and third LED stacks 23, 33, and 43, respectively, and the upper common connector 67c is electrically connected to the first conductivity type semiconductor layers 23a, 33a, and 43a of the first, second, and third LED stacks 23, 33, and 43.

Figure 11A:
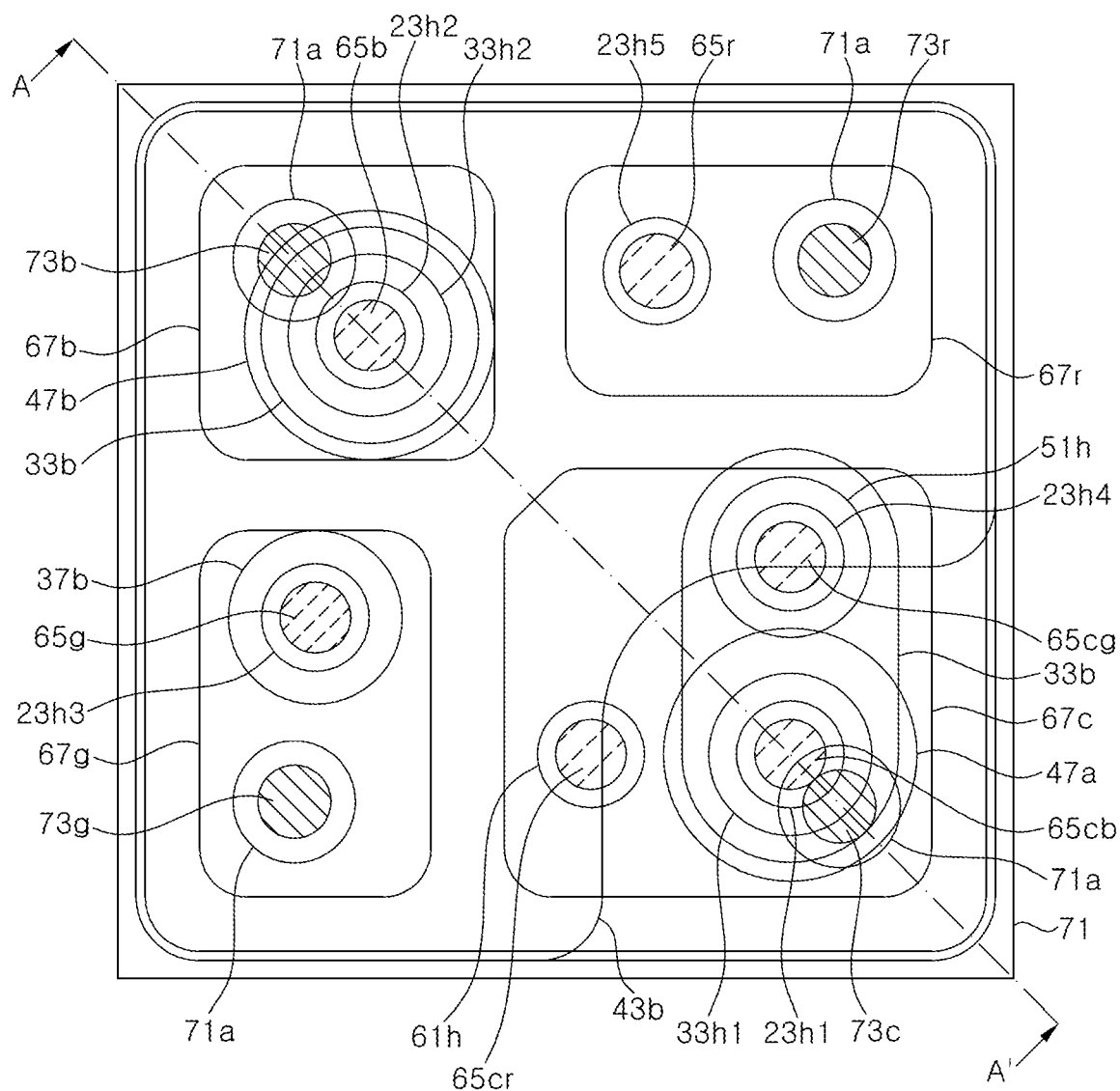
Figure 11B:
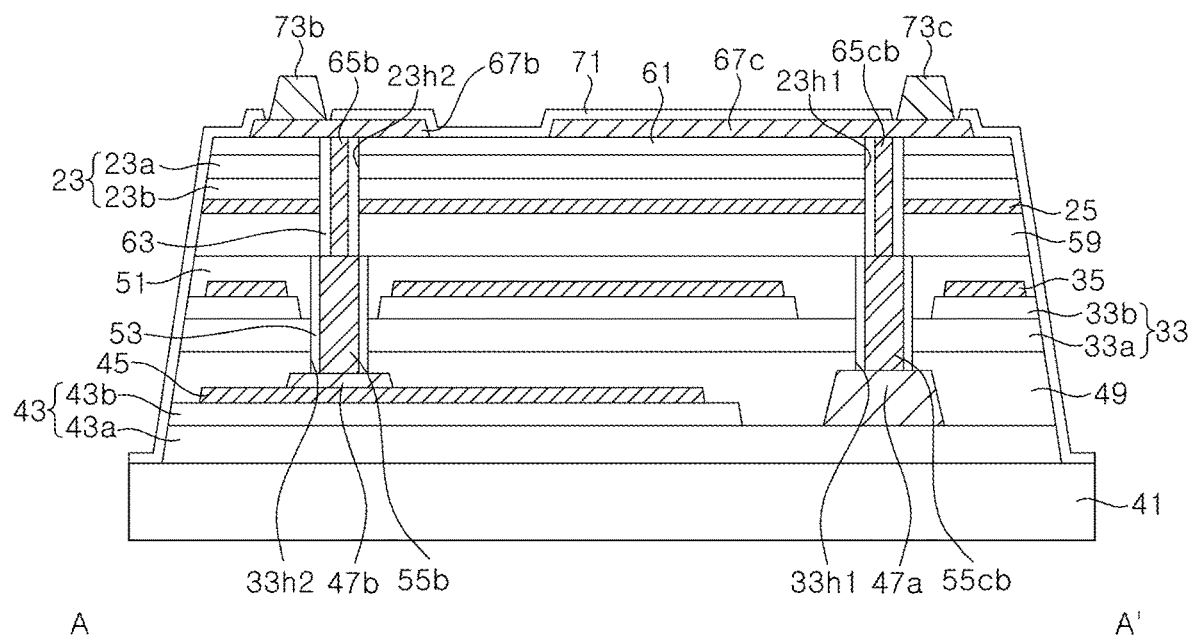

Referring to FIG. 11A and FIG. 11B, an isolation trench is formed to define a region of the light emitting device 100 by an isolation process. The isolation trench may expose the third substrate 41 along peripheries of the first, second, and third LED stacks 23, 33, and 43. Between regions of the light emitting device 100, the isolation trench may be formed by sequentially removing the first LED stack 23, the first transparent electrode 25, the second bonding layer 59, the lower insulation layer 51, the second LED stack 33, the first bonding layer 49, and the third LED stack 43. In this case, the second transparent electrode 35 and the third transparent electrode 45 are not exposed during the isolation process, and thus, the second transparent electrode 35 and the third transparent electrode 45 may not be damaged by an etching gas. When the second and third transparent electrodes 35 and 45 are formed of ZnO, ZnO may be easily damaged by etching gas. However, according to the illustrated exemplary embodiment, since the second and third transparent electrodes 35 and 45 are recessed inwardly, the second transparent electrode 35 and the third transparent electrode 45 may be prevented from being exposed to an etching gas.

In the illustrated exemplary embodiment, the first, second, and third LED stacks 23, 33, and 43 are described as being sequentially patterned through the isolation process, but the inventive concepts are not limited thereto. For example, in some exemplary embodiments, the third LED stack 43 may be removed in advance in a region where the isolation trench will be formed before bonding the second LED stack 33, or the second LED stack 33 may be removed in advance in the region in which the isolation trench will be formed before bonding the first LED stack 23. In this case, the region where the third LED stack 43 is removed may be filled with the first bonding layer 49, and the region where the second LED stack 33 is removed may be filled with the second bonding layer 59. Accordingly, the second and third LED stacks 33 and 43 may not be exposed in the isolation process.

In some exemplary embodiments, the isolation process may be performed before forming the upper connectors 67r, 67g, 67b, and 67c. In this case, a protective insulation layer covering the intermediate insulation layer 61 may be added to protect the sidewalls exposed by the isolation process. The protective insulation layer may have openings exposing the upper buried layers 65b, 65cb, 65g, 65cg, 65r, and 65cr, and the protective insulation layer may be formed so that the upper connectors 67r, 67g, 67b, and 67c are electrically connected to the upper buried layers 65b, 65cb, 65g, 65cg, 65r, and 65cr.

An upper insulation layer 71 covering the upper connectors 67r, 67g, and 67b, and 67c is formed. The upper insulation layer 71 may cover the intermediate insulation layer 61 or the protective insulation layer.

The upper insulation layer 71 may cover side surfaces of the first, second, and third LED stacks 23, 33, and 43. The upper insulation layer 71 may be patterned to have openings 71a exposing the first, second, and third upper connectors 67r, 67g, and 67b, and the upper common connector 67c.

Subsequently, bump pads 73r, 73g, 73b, and 73c may be formed in the openings 71a, respectively. The first bump pad 73r is disposed on the first upper connector 67r, the second bump pad 73g is disposed on the second upper connector 67g, and the third bump pad 73b is disposed on the third upper connector 67b. The common bump pad 73c is disposed on the upper common connector 67c.

Figure 12:
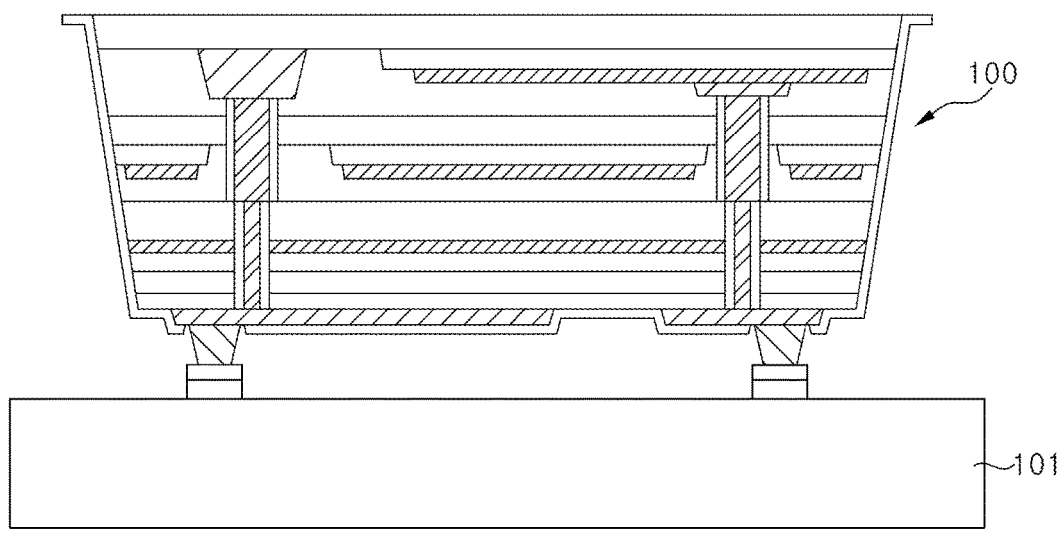
FIG. 12 is a schematic cross-sectional view illustrating a light emitting device mounted on a circuit board according to an exemplary embodiment.

Then, the light emitting device 100 is bonded onto a circuit board 101 as shown in FIG. 12, and the third substrate 41 may be separated from the light emitting device 100. FIG. 12 exemplarily illustrates a schematic cross-sectional view of the light emitting device 100 bonded to the circuit board 101.

Although FIG. 12 exemplarily illustrates a single light emitting device 100 disposed on the circuit board 101, however, a plurality of light emitting devices 100 may be mounted on the circuit board 101. Each of the light emitting devices 100 may form one pixel capable of emitting any one of blue light, green light, and red light, and a plurality of pixels arranged on the circuit board 101 provides a display panel.

Figure 13A:
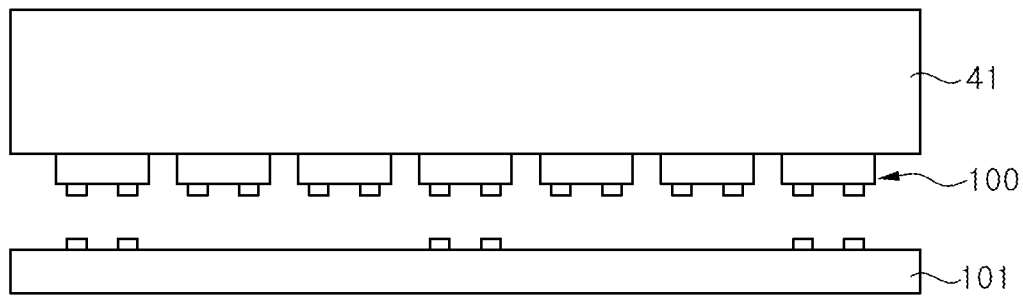
FIGS. 13A, 13B, and 13C are schematic cross-sectional views illustrating a method of transferring a light emitting device to a circuit board according to an exemplary embodiment.
Figure 13B:
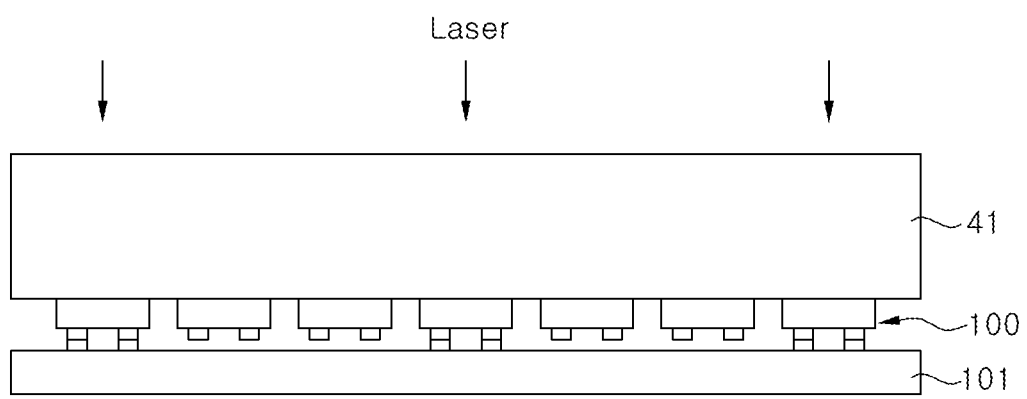
Figure 13C:
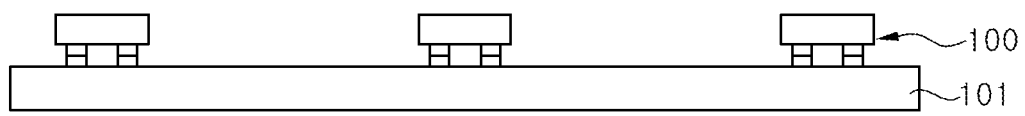

The plurality of light emitting devices 100 may be formed on the substrate 41, and the light emitting devices 100 may be transferred onto the circuit board 101 in a group, not individually. FIG. 13A, FIG. 13B, and FIG. 13C are schematic cross-sectional views illustrating a method of transferring the light emitting device to the circuit board according to an exemplary embodiment. Hereinafter, a method of transferring the light emitting devices 100 formed on the substrate 41 to the circuit board 101 in a group will be described.

Referring to FIG. 13A, as described with reference to FIG. 11A and FIG. 11B, when the manufacturing process of the light emitting device 100 on the substrate 41 is completed, the plurality of light emitting devices 100 is isolated from one another and arranged on the substrate 41 by the isolation trench.

The circuit board 101 may have pads formed on an upper surface thereof. The pads on the circuit board 101 may correspond to locations where the pixels for a display are to be arranged. In general, an interval between the light emitting devices 100 arranged on the substrate 41 may be less than that of the pixels on the circuit board 101.

Referring to FIG. 13B, bump pads of the light emitting devices 100 are bonded to the pads of the circuit board 101. The bump pads and the pads may be bonded using In bonding, for example. In this case, the light emitting devices 100 that are positioned between pixel regions may be spaced apart from the circuit board 101, since these light emitting devices 100 do not have corresponding pads of the circuit board 101 to be boned to.

Subsequently, a laser is irradiated onto the substrate 41. The light emitting devices 100 to be bonded to the pads are selectively irradiated with the laser. In this case, a mask having openings to selectively expose the light emitting devices 100 may be formed on the substrate 41.

Thereafter, the light emitting devices 100 are selectively transferred to the circuit is board 101 by separating the light emitting devices 100 irradiated with the laser from the substrate 41. Accordingly, as shown in FIG. 13C, the display panel in which the light emitting devices 100 are arranged on the circuit board 101 is provided. The display panel may be mounted on various display apparatuses as described with reference to FIG. 1.

Figure 14:
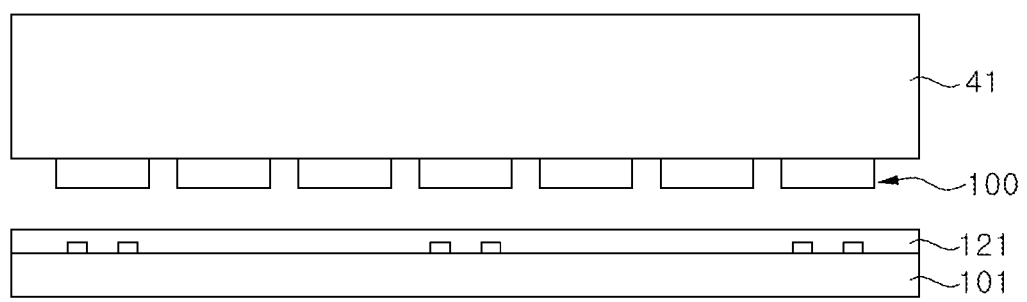
FIG. 14 is a schematic cross-sectional view illustrating a method of transferring a light emitting device to a circuit board according to another exemplary embodiment.

FIG. 14 is a schematic cross-sectional view illustrating a method of transferring a light emitting device to a circuit board according to another exemplary embodiment.

Referring to FIG. 14, the method of transferring a light emitting device according to the illustrated exemplary embodiment uses an anisotropic conductive adhesive film or an anisotropic conductive adhesive paste to bond the light emitting devices to the pads. More particularly, the anisotropic conductive adhesive film or an adhesive paste 121 is provided on the pads, and the light emitting devices 100 may be adhered to the pads through the anisotropic conductive adhesive film or the adhesive paste 121. The light emitting devices 100 are electrically connected to the pads by a conductive material within the anisotropic conductive adhesive film or the adhesive paste 121.

In some exemplary embodiments, the bump pads 73*r*, 73*g*, 73*b*, and 73*c* may be omitted, and the upper connectors 67*r*, 67*g*, 67*b*, and 67*c* may be electrically connected to the pads 73*r*, 73*g*, 73*b*, and 73*c* through the conductive material.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device for a display, comprising:
   a first LED stack;
   a second LED stack disposed under the first LED stack;
   a third LED stack disposed under the second LED stack, and including a first conductivity type semiconductor layer and a second conductivity type semiconductor layer;
   a first bonding layer interposed between the second LED stack and the third LED stack;
   a second bonding layer interposed between the first LED stack and the second LED stack;
   a lower insulation layer interposed between the first LED stack and the third LED stack;
   a plurality of lower buried layers passing through the second LED stack and the lower insulation layer to be electrically connected to the first conductivity type semiconductor layer and the second conductivity type semiconductor layer of the third LED stack, respectively;
   a first sidewall insulation layer covering a sidewall of each of the lower buried layers;
   a plurality of upper buried layers passing through the first LED stack and the second bonding layer to be electrically connected to the lower buried layers; and
   a plurality of upper connectors disposed on the first LED stack,
   wherein the upper connectors cover the upper buried layers and are electrically connected to the upper buried layers, respectively, and
   wherein the first sidewall insulation layer continuously extends from the second LED stack to a portion of the third LED stack.

2. The light emitting device for a display of claim 1, wherein the first, second, and third LED stacks are configured to emit red light, green light, and blue light, respectively.

3. The light emitting device for a display of claim 1, wherein:
   the first LED stack longitudinally extends along a first direction; and
   the upper buried layers have narrower widths along the first direction than those of the lower buried layers.

4. The light emitting device for a display of claim 3, wherein the upper buried layers are disposed on upper surfaces of the lower buried layers, respectively.

5. The light emitting device for a display of claim 1, further comprising:

a first electrode pad electrically connected to the first conductivity type semiconductor layer of the third LED stack; and
a lower second electrode pad disposed on the second conductivity type semiconductor layer of the third LED stack,
wherein first and second ones of the lower buried layers are electrically connected to the first electrode pad and the lower second electrode pad, respectively.

6. The light emitting device for a display of claim 5, wherein:
each of the first and second LED stacks includes a first conductivity type semiconductor layer and a second conductivity type semiconductor layer;
a third one of the lower buried layers passes through the lower insulation layer to be electrically connected to the first conductivity type semiconductor layer of the second LED stack;
a first one of the upper buried layers passes through the first LED stack and the second bonding layer to be electrically connected to the third one of the lower buried layers; and
a first one of the upper connectors is electrically connected to the first conductivity type semiconductor layer of the second LED stack through the first one of the upper buried layers and the third one of the lower buried layers.

7. The light emitting device for a display of claim 6, wherein the first one of the upper connectors is electrically connected to the first conductivity type semiconductor layers of the first, second, and third LED stacks.

8. The light emitting device for a display of claim 7, wherein:
a second one of the upper buried layers passes through the first LED stack, the second bonding layer, and the lower insulation layer to be electrically connected to the second conductivity type semiconductor layer of the second LED stack; and
a second one of the upper connectors is connected to the second one of the upper buried layers to be electrically connected to the second conductivity type semiconductor layer of the second LED stack.

9. The light emitting device for a display of claim 8, wherein a third one of the upper connectors is electrically connected to the second conductivity type semiconductor layer of the first LED stack.

10. The light emitting device for a display of claim 9, further comprising an intermediate insulation layer disposed between the first LED stack and the upper connectors, wherein:
a third one of the upper buried layers passes through the intermediate insulation layer to be electrically connected to the second conductivity type semiconductor layer of the first LED stack; and
the third one of the upper connectors is electrically connected to the second conductivity type semiconductor layer of the first LED stack through the third one of the upper buried layers.

11. The light emitting device for a display of claim 9, further comprising first, second, and third bump pads, and common bump pads, wherein:
the common bump pad is commonly electrically connected to the first, second, and third LED stacks; and
the first, second, and third bump pads are electrically connected to the first, second, and third LED stacks, respectively.

12. The light emitting device for a display of claim 1, further comprising:
a first transparent electrode interposed between the first LED stack and the second LED stack, and in ohmic contact with a lower surface of the first LED stack;
a second transparent electrode interposed between the first LED stack and the second LED stack, and in ohmic contact with an upper surface of the second LED stack; and
a third transparent electrode interposed between the second LED stack and the third LED stack, and in ohmic contact with an upper surface of the third LED stack,
wherein one of the first, second, and third transparent electrodes includes a material different from the remaining transparent electrodes.

13. The light emitting device for a display of claim 12, wherein the first transparent electrode includes ITO, and the second and third transparent electrodes include ZnO.

14. The light emitting device for a display of claim 12, wherein:
each of the first, second, and third transparent electrodes contacts the corresponding second conductivity type semiconductor layer of the first, second, and third LED stacks; and
the second and third transparent electrodes are recessed to have an area less than that of the second conductivity type semiconductor layer of the second LED stack and that of the second conductivity type semiconductor layer of the third LED stack, respectively.

15. The light emitting device for a display of claim 12, further comprising an upper second electrode pad disposed on the second transparent electrode to be electrically connected to the second conductivity type semiconductor layer of the second LED stack,
wherein:
one of the upper buried layers passes through the first LED stack to be electrically connected to the upper second electrode pad; and
one of the upper connectors is connected to the one of the upper buried layers to be electrically connected to the upper second electrode pad.

16. The light emitting device for a display of claim 1, further comprising
a second sidewall insulation layer covering sidewalls of the upper buried layers.

17. The light emitting device for a display of claim 16, wherein the first and second sidewall insulation layers include $Al_2O_3$.

18. The light emitting device for a display of claim 1, wherein each of the first, second, and third LED stacks does not include a growth substrate.

19. The light emitting device for a display of claim 1, further comprising an intermediate insulation layer covering the first LED stack, wherein:
upper surfaces of the lower buried layers are in flush with an upper surface of the lower insulation layer; and
upper surfaces of the upper buried layers are in flush with an upper surface of the intermediate insulation layer.

20. The light emitting device for a display of claim 1, wherein:
the first, second, and third LED stacks are configured to be independently driven;
light generated from the first LED stack is configured to be emitted to the outside by passing through the second LED stack and the third LED stack; and light generated from the second LED stack is configured to be emitted to the outside by passing through the third LED stack.

21. A display apparatus comprising:
a circuit board; and
a plurality of light emitting devices arranged on the circuit board, each of the light emitting devices comprising:
a first LED stack;
a second LED stack disposed under the first LED stack;
a third LED stack disposed under the second LED stack;
a first bonding layer interposed between the second LED stack and the third LED stack;
a second bonding layer interposed between the first LED stack and the second LED stack;
a lower insulation layer interposed between the first LED stack and the third LED stack;
a plurality of lower buried layers passing through the lower insulation layer and the second LED stack to be electrically connected to a first conductivity type semiconductor layer and a second conductivity type semiconductor layer of the third LED stack, respectively;
a first sidewall insulation layer covering a sidewall of each of the lower buried layers;
a plurality of upper buried layers passing through the first LED stack and the first bonding layer to be electrically connected to the lower buried layers; and
a plurality of upper connectors disposed on the first LED stack,
wherein the upper connectors cover the upper buried layers and are electrically connected to the upper buried layers, respectively, and
wherein the first sidewall insulation layer continuously extends from the second LED stack to a portion of the third LED stack.

* * * * *